United States Patent
Wei et al.

(10) Patent No.: US 9,734,976 B2
(45) Date of Patent: Aug. 15, 2017

(54) ARRAY OF CARBON NANOTUBE MICRO-TIP STRUCTURES

(71) Applicants: Tsinghua University, Beijing (CN); HON HAI PRECISION INDUSTRY CO., LTD., New Taipei (TW)

(72) Inventors: Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

(*) Notice: Subject to any disclaimer, the term of this patent is extended or adjusted under 35 U.S.C. 154(b) by 0 days.

(21) Appl. No.: 15/214,779

(22) Filed: Jul. 20, 2016

(65) Prior Publication Data

US 2016/0329184 A1    Nov. 10, 2016

Related U.S. Application Data

(62) Division of application No. 13/592,751, filed on Aug. 23, 2012, now Pat. No. 9,437,391.

(30) Foreign Application Priority Data

Feb. 23, 2012 (CN) .......................... 2012 1 0042274

(51) Int. Cl.
*H01J 1/14* (2006.01)
*H01J 1/304* (2006.01)
(Continued)

(52) U.S. Cl.
CPC .............. *H01J 1/14* (2013.01); *H01J 1/3044* (2013.01); *H01J 9/042* (2013.01); *H01J 37/073* (2013.01); *H01J 63/02* (2013.01); *H01J 63/06* (2013.01); *H01J 2201/196* (2013.01); *H01J 2201/30411* (2013.01); *H01J 2201/30469* (2013.01); *H01J 2237/06316* (2013.01); *H01J 2237/06333* (2013.01); *H01J 2237/06341* (2013.01);
(Continued)

(58) Field of Classification Search
CPC .. H01J 1/14; H01J 9/042; H01J 1/3044; H01J 2201/196; H01J 2201/30469; H01J 2201/30411
See application file for complete search history.

(56) References Cited

U.S. PATENT DOCUMENTS 8,716,938 B2 * 5/2014 Wei .......................... H01J 1/16
                                                                315/111.01
9,437,391 B2 * 9/2016 Wei .......................... H01J 1/14
(Continued)

*Primary Examiner* — Nathan Van Sell
(74) *Attorney, Agent, or Firm* — Steven Reiss

(57) ABSTRACT

An array of carbon nanotube micro-tip structure includes an insulating substrate and a plurality of patterned carbon nanotube film structures. The insulating substrate includes a surface. The surface includes an edge. A plurality of patterned carbon nanotube film structures spaced from each other. Each of the plurality of patterned carbon nanotube film structures is partially arranged on the surface of the insulating substrate. Each of the plurality of patterned carbon nanotube film structures comprises two strip-shaped arms joined together forming a tip portion protruding and suspending from the edge of the surface of the insulating substrate. Each of the two strip-shaped arms comprises a plurality of carbon nanotubes parallel to the surface of the insulating substrate.

13 Claims, 26 Drawing Sheets

(51) Int. Cl.
*H01J 37/073* (2006.01)
*H01J 63/02* (2006.01)
*H01J 63/06* (2006.01)
*H01J 9/04* (2006.01)

(52) U.S. Cl.
CPC ....... *H01J 2237/26* (2013.01); *H01J 2237/28* (2013.01); *H01J 2329/0455* (2013.01); *Y10T 428/24132* (2015.01)

(56) References Cited

U.S. PATENT DOCUMENTS

| | | | |
|---|---|---|---|
| 2005/0110064 A1* | 5/2005 | Duan | B82Y 10/00 257/296 |
| 2010/0155696 A1* | 6/2010 | Duan | B82Y 10/00 257/14 |

* cited by examiner

ARRAY OF CARBON NANOTUBE MICRO-TIP STRUCTURES

CROSS-REFERENCE TO RELATED APPLICATIONS

This application is a divisional application of U.S. patent application Ser. No. 13/592,751, filed Aug. 23, 2012, entitled, "CARBON NANOTUBE BASED MICRO-TIP STRUCTURE AND METHOD FOR MAKING THE SAME", which claims all benefits accruing under 35 U.S.C. §119 from China Patent Application No. 201210042274.8, filed on 2012 Feb. 23 in the China Intellectual Property Office.

BACKGROUND

1. Technical Field

The present disclosure relates to a carbon nanotube micro-tip structure and a method for making the carbon nanotube micro-tip structure.

2. Description of Related Art

Carbon nanotubes are carbon tubules having a diameter of 0.5 nanometers to 100 nanometers, and composed of a number of coaxial cylinders of graphite sheets. Because the size of the carbon nanotube is extremely small, it is difficult to precisely arrange the carbon nanotube when manufacturing a carbon nanotube based micro sized device. Although a microscope can be used during the manufacturing process to observe the carbon nanotube, a batch of substantially similar micro sized devices are difficult to manufacture by operating the individual carbon nanotubes under the microscope. Therefore, the carbon nanotube based micro sized device is difficult to produce.

What is needed, therefore, is to provide a carbon nanotube micro-tip structure and a method for making a batch of substantially identical carbon nanotube micro-tip structures.

BRIEF DESCRIPTION OF THE DRAWINGS

Many aspects of the embodiments can be better understood with reference to the following drawings. The components in the drawings are not necessarily to scale, the emphasis instead being placed upon clearly illustrating the principles of the present disclosure. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
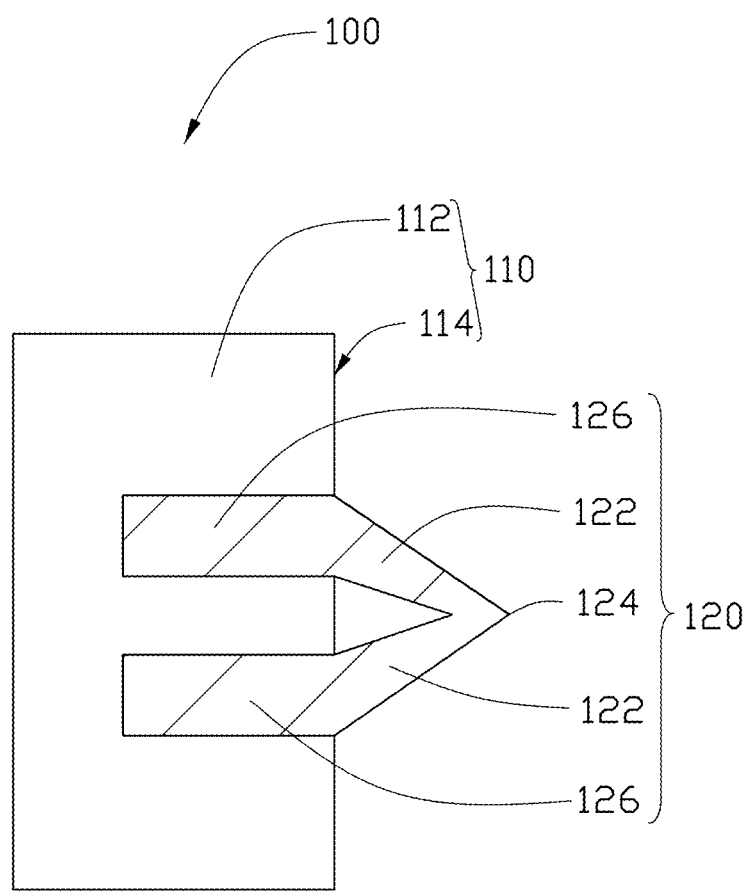
FIG. 1 is a schematic top view of one embodiment of a carbon nanotube micro-tip structure.

Referring to FIG. 1, one embodiment of a carbon nanotube micro-tip structure 100 includes an insulating substrate 110 and a patterned carbon nanotube film structure 120. The insulating substrate 110 includes a surface 112. The surface 112 has an edge 114. The patterned carbon nanotube film structure 120 is partially arranged on the surface 112 of the insulating substrate 110. The patterned carbon nanotube film structure 120 includes two strip-shaped arms 122. The two strip-shaped arms 122 can be narrow and long film shapes.

The two strip-shaped arms 122 are joined at one end to form a tip portion 124 of the patterned carbon nanotube film structure 120. An angle α between lengthwise directions of the two strip-shaped arms 122 can be smaller than 180°. The tip portion 124 of the patterned carbon nanotube film structure 120 protrudes from the edge 114 of the surface 112 of the insulating substrate 110 and is suspended. The patterned carbon nanotube film structure 120 includes a plurality of carbon nanotubes substantially parallel to the surface 112 of the insulating substrate 110.

The insulating substrate 110 can be a board or a sheet. A material of the insulating substrate 110 can be silicon, ceramic, glass, resin, or crystal. The insulating substrate 110 can also be a silicon substrate having a silicon oxide layer coated on the surface 112. A thickness of the silicon oxide layer can be about 1 micron. An entire thickness of the insulating substrate 110 can be about 0.5 millimeters.

The patterned carbon nanotube film structure 120 can be a free-standing film shaped structure and can include a plurality of carbon nanotube films stacked together. Each carbon nanotube film may include a plurality of carbon nanotubes substantially aligned along the same direction. The carbon nanotube film can be an ordered and free-standing carbon nanotube film.

Figure 2:
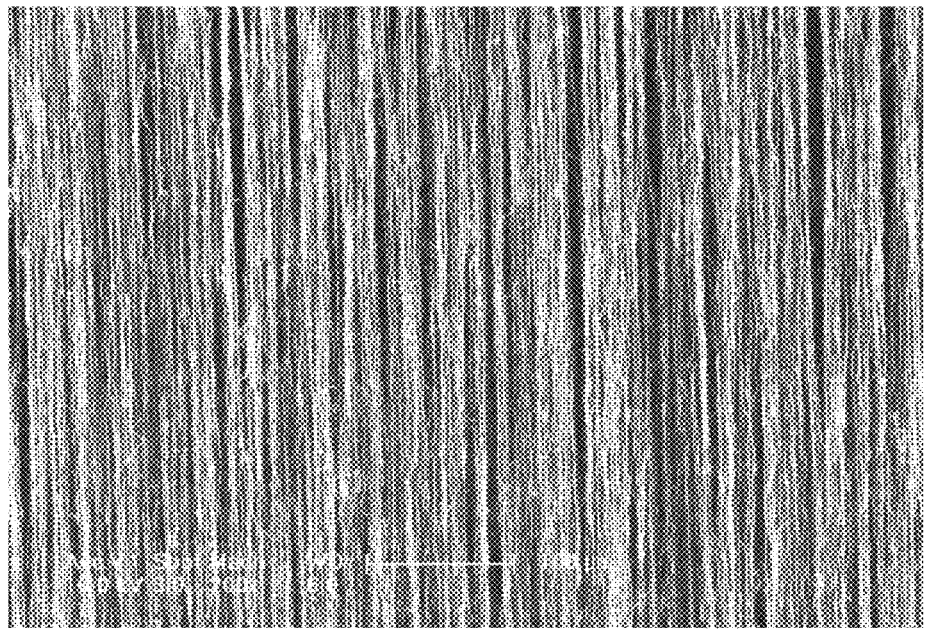
FIG. 2 is a scanning electron microscope (SEM) image of a carbon nanotube film drawn from a carbon nanotube array.

Referring to FIG. 2, the ordered and free-standing carbon nanotube film can be drawn from a carbon nanotube array. The carbon nanotube film can include or consist of a plurality of carbon nanotubes. In the carbon nanotube film, the overall aligned direction of a majority of carbon nanotubes is substantially aligned along the same direction parallel to a surface of the carbon nanotube film. A majority of the carbon nanotubes are substantially aligned along the same direction in the carbon nanotube film. Along the aligned direction of the majority of carbon nanotubes, each carbon nanotube is joined to adjacent carbon nanotubes end to end by van der Waals attractive force therebetween, whereby the carbon nanotube film is capable of being free-standing structure. There may be a minority of carbon nanotubes in the carbon nanotube film that are randomly aligned. However, the number of the randomly aligned carbon nanotubes is very small and does not affect the overall oriented alignment of the majority of carbon nanotubes in the carbon nanotube film. The majority of the carbon nanotubes in the carbon nanotube film that are substantially aligned along the same direction may not be exactly straight, and can be curved at a certain degree, or are not exactly aligned along the overall aligned direction, and can deviate from the overall aligned direction by a certain degree. Therefore, partial contacts can exist between the juxtaposed carbon nanotubes in the majority of the carbon nanotubes aligned along the same direction in the carbon nanotube film. The carbon nanotube film may include a plurality of successive and oriented carbon nanotube segments. The plurality of carbon nanotube segments are joined end to end by van der Waals attractive force. Each carbon nanotube segment includes a plurality of carbon nanotubes substantially parallel to each other, and the plurality of paralleled carbon nanotubes are in contact with each other and combined by van der Waals attractive force therebetween. The carbon nanotube segment has a desired length, thickness, uniformity, and shape. There can be clearances between adjacent and juxtaposed carbon nanotubes in the carbon nanotube film. A thickness of the carbon nanotube film at the thickest location is about 0.5 nanometers to about 100 microns (e.g., in a range from 0.5 nanometers to about 10 microns).

The term "free-standing" includes, but not limited to, a carbon nanotube film that does not have to be supported by a substrate. For example, a free-standing carbon nanotube film can sustain the weight of itself when it is hoisted by a portion thereof without any significant damage to its structural integrity. So, if the free-standing carbon nanotube film is placed between two separate supporters, a portion of the free-standing carbon nanotube film, not in contact with the two supporters, can be suspended between the two supporters and yet maintain a film structural integrity. The free-standing carbon nanotube film is realized by the successive carbon nanotubes joined end to end by van der Waals attractive force.

Figure 3:
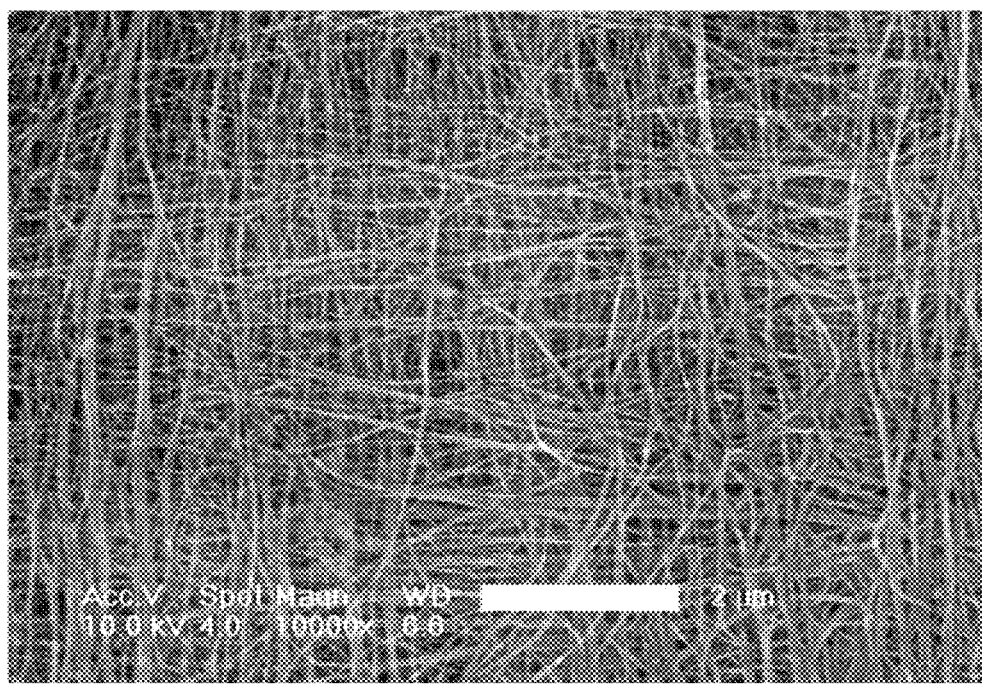
FIG. 3 is an SEM image of one embodiment of a multi-layer structure having a plurality of carbon nanotube films stacked with each other and having carbon nanotubes aligned along different directions.

Referring to FIG. 3, in the patterned carbon nanotube film structure 120, the plurality of ordered carbon nanotube films are stacked together along at least two directions, such that the carbon nanotubes in the carbon nanotube films stacked along different directions are aligned along different directions. An angle β between the carbon nanotubes in the carbon nanotube films stacked along different directions can be in a range of 0°<β≤90°. The number of the carbon nanotube films in the patterned carbon nanotube film structure 120 is not limited, and can be determined by actual needs. In some embodiment, the patterned carbon nanotube film structure 120 can include 5 to 100 stacked carbon nanotube films. In one embodiment, the patterned carbon nanotube film structure 120 includes 50 stacked carbon nanotube films having the angle β of about 90° between the carbon nanotubes of adjacent carbon nanotube films. The patterned carbon nanotube film structure 120 is a stable free-standing film structure because the adjacent carbon nanotubes directly contacting each other are sufficiently joined by van der Waals attractive forces. In the patterned carbon nanotube film structure 120, the adjacent carbon nanotubes are connected with each other, thus forming an electrically conductive network. The carbon nanotube film has an extremely thin thickness. Accordingly, the patterned carbon nanotube film structure 120 having the plurality carbon nanotube films stacked together can have a small thickness. In one embodiment, the thickness of the patterned carbon nanotube film structure 120 having 50 carbon nanotube films stacked together is in a range from about 50 nanometers to about 5 microns. The carbon nanotube film can have a uniform thickness. Accordingly, the patterned carbon nanotube film structure 120 having the plurality carbon nanotube films stacked together can have a uniform thickness, thus having a uniform electrical conductivity.

The patterned carbon nanotube film structure 120 is laid on the surface 112 of the insulating substrate 110. Due to the free-standing property, a portion of the patterned carbon nanotube film structure 120 protruding from the edge 114 of the surface 112 can be suspended and remain parallel to the surface 112 of the insulating substrate 110. That is, the carbon nanotubes in the suspended portion of the patterned carbon nanotube film structure 120 are still parallel to the surface 112 of the insulating substrate 110.

Figure 4:
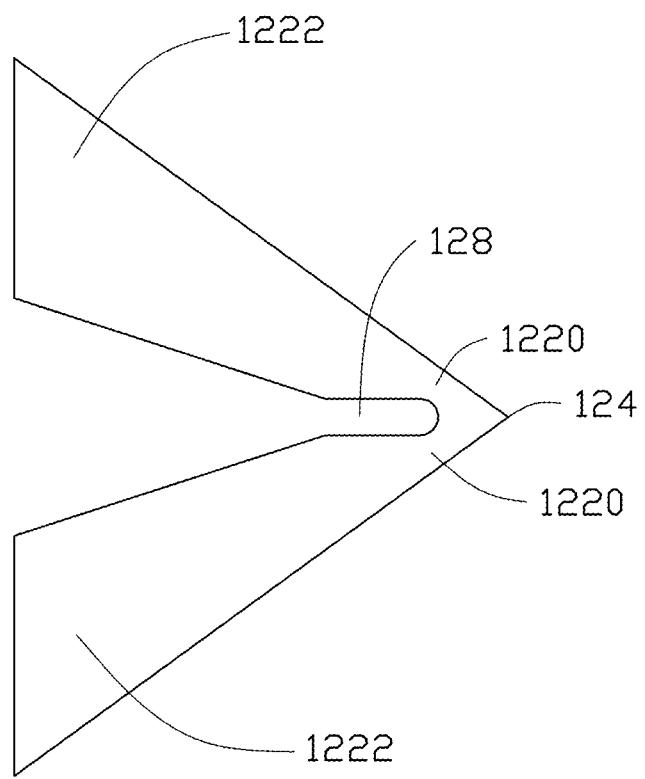
FIG. 4 is a schematic top view of one embodiment of a protruding section of a patterned carbon nanotube film structure.
Figure 5:
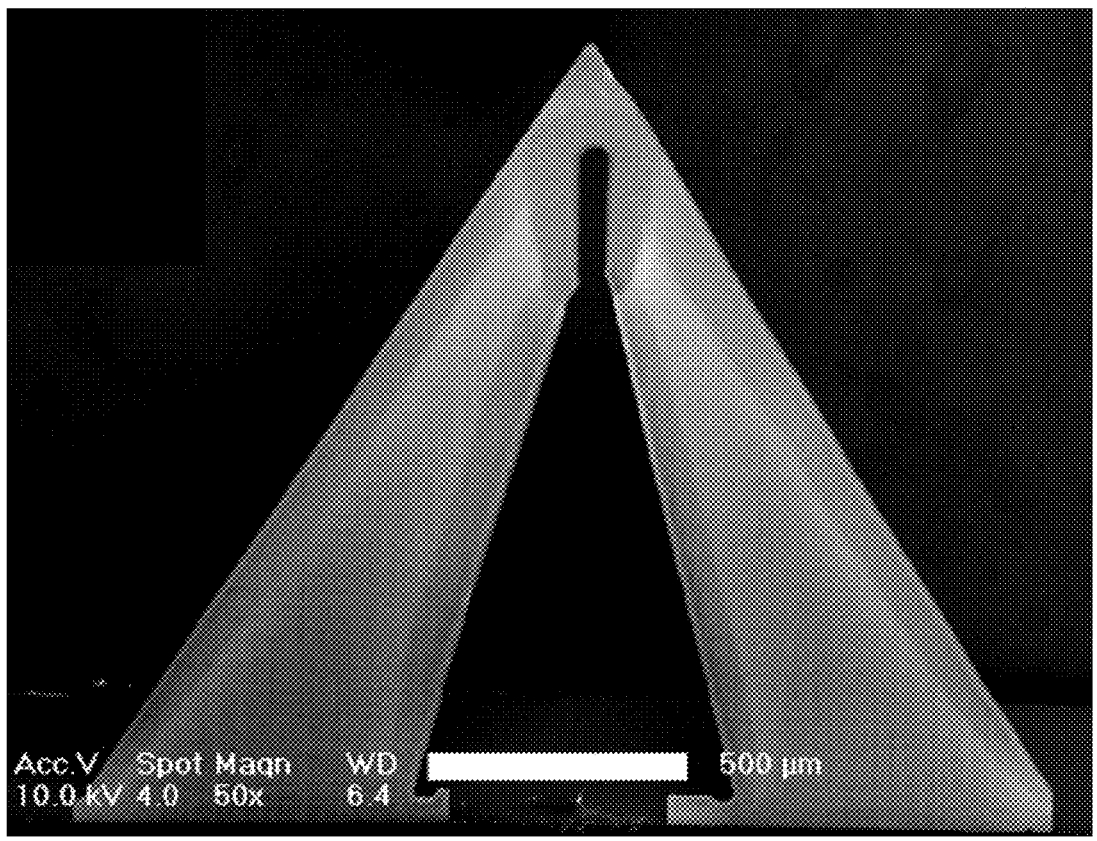
FIG. 5 is an SEM image of one embodiment of the protruding section of the patterned carbon nanotube film structure.

Referring to FIG. 4 and FIG. 5, in the patterned carbon nanotube film structure 120, the two strip-shaped arms 122 are part of an integrated structure formed by patterning a carbon nanotube film structure. The integrated structure can have a V shape or a U shape to form the two strip-shaped arms 122. Each strip-shaped arm 122 has a first end 1220 and a second end 1222 along the lengthwise direction. The two strip-shaped arms 122 are joined together at the first end 1220 to form a tip portion 124. The angle α between the lengthwise directions of the two strip-shaped arms 122 can be smaller than 180°. In some embodiment, the angle α can be in a range from about 15° to about 120°. In one embodiment, the angle α is about 60°. The tip portion 124 can have a size smaller than 20 microns. In one embodiment, the tip portion 124 can only have a single protruding carbon nanotube having a diameter of about 0.5 nanometers. The patterned carbon nanotube film structure 120 can only protrude and suspend the tip portion 124 or can protrude and suspend the entire two strip-shaped arms 122 from the edge 114 of the surface 112 of the insulating substrate 110. The shape of the two strip-shaped arms 122 are not limited but have an overall strip shape. In one embodiment, each strip-shaped arm 122 has a gradually decreased width from the second end 1222 to the first end 1220, to have the resistance gradually increased from the second end 1222 to the first end 1220, which may be useful for a thermionic emission device or a thermal field emission device. In another embodiment, each strip-shaped arm 122 has a uniform width from the second end 1222 to the first end 1220. The width of the strip-shaped arm 122 is not limited and can be in a range from about 10 microns to about 1 millimeter. The width at the first end 1222 can be in a range from about 10 microns to about 300 microns.

The strip-shaped arm 122 can have a uniform thickness or a blade-shaped thickness that is thicker at the middle of the strip-shaped arm 122 compared to the thickness at the edge of the strip-shaped arm 122. Referring to FIG. 5, the strip-shaped arm 122 has a light color at the middle and a gradually darkened color from the middle to the edge. This shows that the edge of the strip-shaped arm 122 is thinner than the middle of the strip-shaped arm 122. The thickness of the strip-shaped arm 122 at the edge can be nanosize (e.g., smaller than 100 nanometers). The blade-shaped thickness that is thicker at the middle of the strip-shaped arm 122 may have a relatively good field emission performance in the field emission device.

Figure 6:
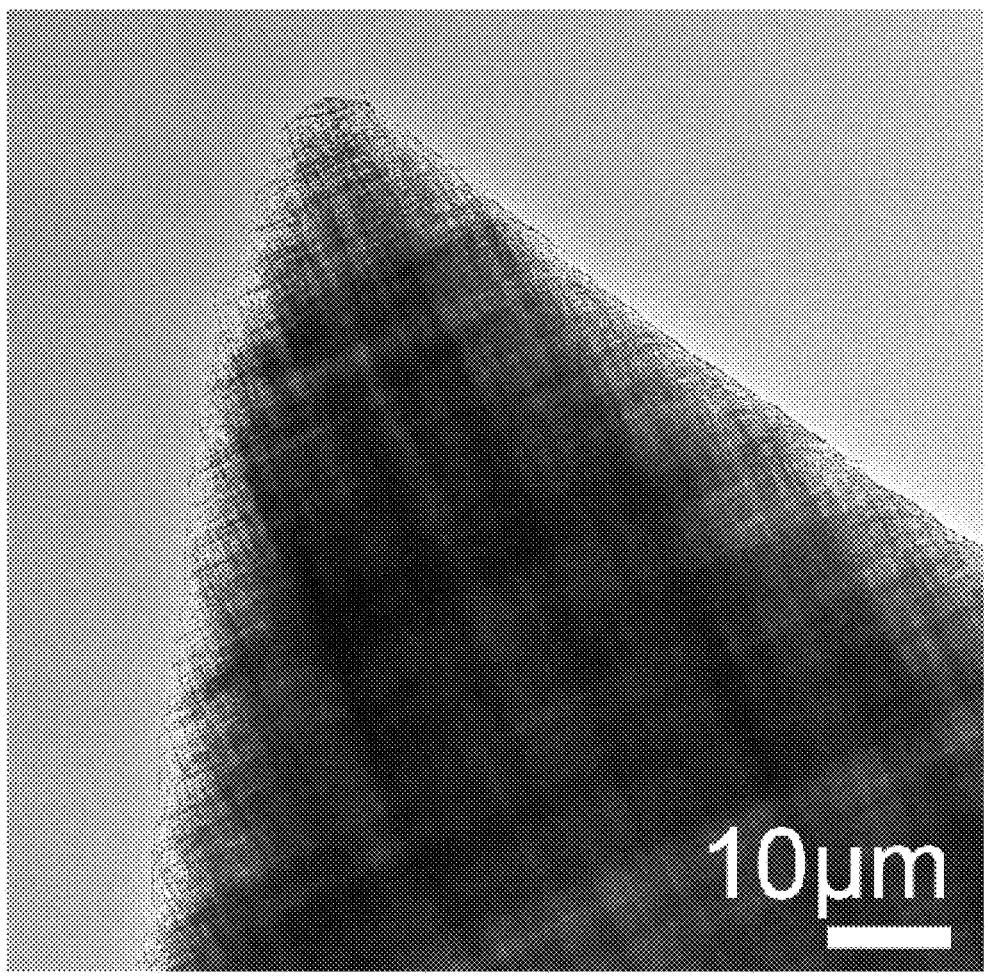
FIG. 6 is a transmission electron microscope (TEM) image of one embodiment of a tip portion of the patterned carbon nanotube film structure.
Figure 7:
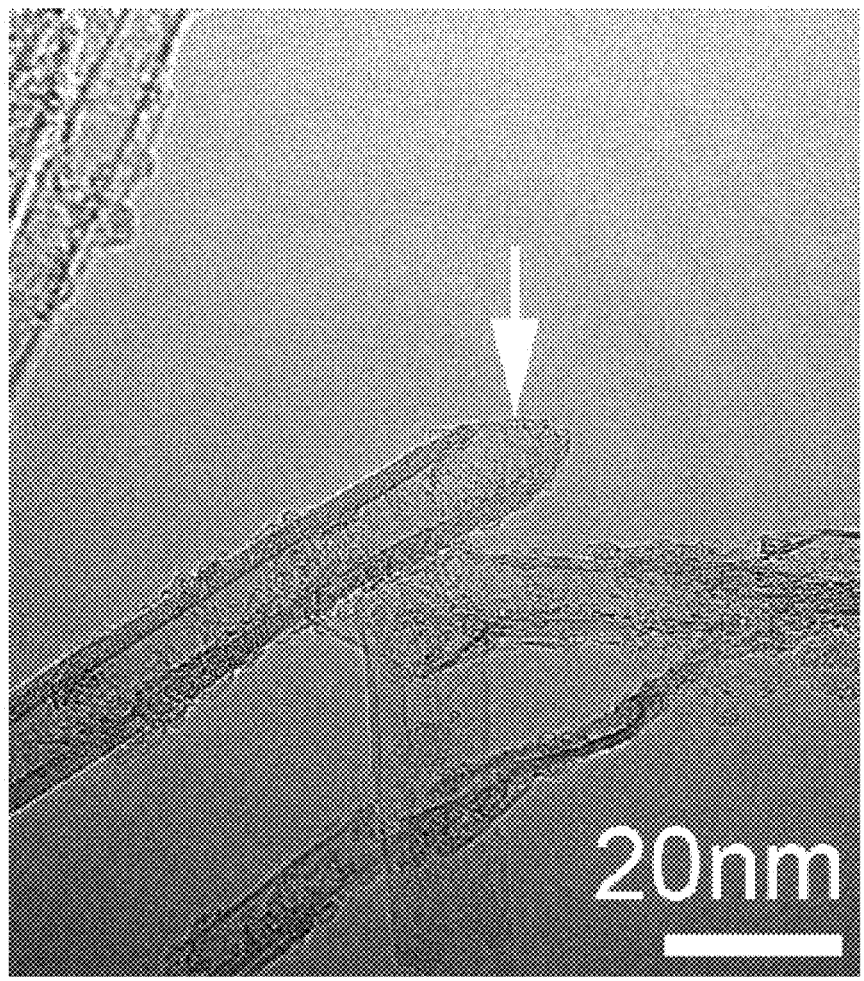
FIG. 7 is a TEM image of one embodiment of carbon nanotubes in the tip portion of the patterned carbon nanotube film structure.

The two strip-shaped arms 122 can be reflection symmetrical about a symmetry axis passing through the tip portion 124. In the patterned carbon nanotube film structure 120, at least one carbon nanotube film can have the majority of carbon nanotubes aligned along the symmetry axis. In one embodiment, the edge 114 of the surface 112 is straight, and the symmetry axis can be perpendicular to the edge 114. Referring to FIG. 6, in one embodiment, the symmetry axis is perpendicular to the edge 114, half of the carbon nanotube films have the carbon nanotubes aligned along the symmetry axis and the other half of the carbon nanotube films have the carbon nanotubes aligned perpendicular to the symmetry axis. Referring to FIG. 7, in one embodiment, the carbon nanotubes at the tip portion 124 can have an open end (as pointed by the arrow in the FIG. 7), which may facilitate the electron emission in the field emission device.

The smaller width at the first end 1220 of the two strip-shaped arms 122 may facilitate the electron emission in the field emission device. The patterned carbon nanotube film structure 120 can further include a cutout 128 at the joining portion of the two strip-shaped arms 122. The cutout 128 can be a line shape. The lengthwise direction of the cutout 128 can be parallel to the surface 112 of the insulating substrate 110, and extend along a direction from the edge 114 to the tip portion 124. The width of the cutout 128 can be uniform or gradually decreasing from the edge 114 to the tip portion 124. A distance exists from the end of the cutout 128 to the top of the tip portion 124, where the two strip-shaped arms 122 join together. In one embodiment, the distance from the end of the cutout 128 to the top of the tip portion 124 is about 210 microns. The resistance at the tip portion 124 can be increased by defining the cutout 128 in the patterned carbon nanotube film structure 120, which may improve the thermal emission performance or thermal field emission performance. In one embodiment, the two strip-shaped arms 122 are symmetrical about the symmetry axis, and the lengthwise direction of the cutout 128 can be along the symmetry axis. The patterned carbon nanotube film structure 120 can be seen as a bent conductive strip having the narrowest width and greatest resistance at the tip portion 124.

Referring back to FIG. 1, to facilitate the connection between the patterned carbon nanotube film structure 120 and an outer circuit and while supporting the suspended portion, the patterned carbon nanotube film structure 120 can further include two connecting portions 126. The two connecting portions 126 are respectively connected to the two strip-shaped arms 122 and located on the surface 112 of the insulating substrate 110. Similar to the two strip-shaped arms 122, the two connecting portions 126 are also formed by patterning the carbon nanotube film structure. The two connecting portions 126 and the two strip-shaped arms 122 are part of the integrated structure. The shape of the connecting portion 126 is not limited. In one embodiment, the connecting portion 126 has a rectangular strip shape having the same width as the second end 1222 of the strip-shaped arm 122.

The tip portion 124, the two connecting portions 126, and the two strip-shaped arms 122 are portions of the integrated structure (i.e., the integrated patterned carbon nanotube film structure 120). In one embodiment, the patterned carbon nanotube film structure 120 only includes the carbon nanotubes.

Figure 8:
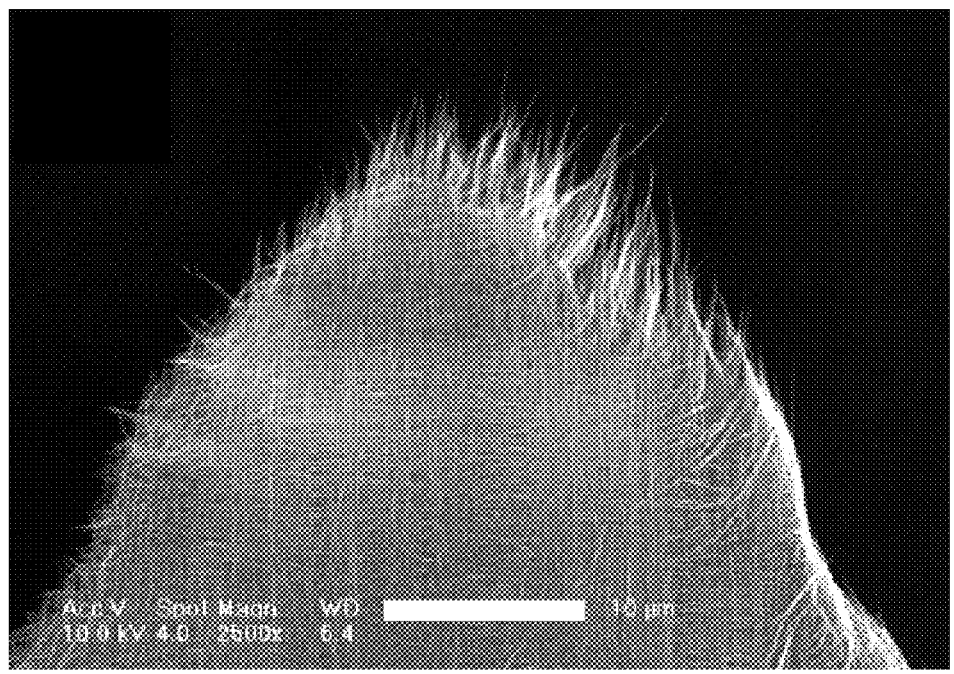
FIG. 8 is an SEM image of another embodiment of the tip portion of the patterned carbon nanotube film structure.

Referring to FIG. 8, another embodiment of the carbon nanotube micro-tip structure is similar to the carbon nanotube micro-tip structure 100 except that the patterned carbon nanotube film structure 120 includes a plurality of carbon nanotubes protruding from the tip portion 124. The plurality of protruded carbon nanotubes extend radially from the tip portion 124 and are spaced from each other, to form a plurality of micro-tips at the tip portion 124 in a microscopic view. In one embodiment of a field emission device having this carbon nanotube micro-tip structure, the plurality of micro-tips can emit more electrons to an anode. The plurality of protruded carbon nanotubes also belong to the patterned carbon nanotube film structure 120, and are integrated to the two strip-shaped arms 122. The plurality of protruded carbon nanotubes are joined to the carbon nanotubes in the two strip-shaped arms 122 by van der Waals attractive force.

Figure 9:
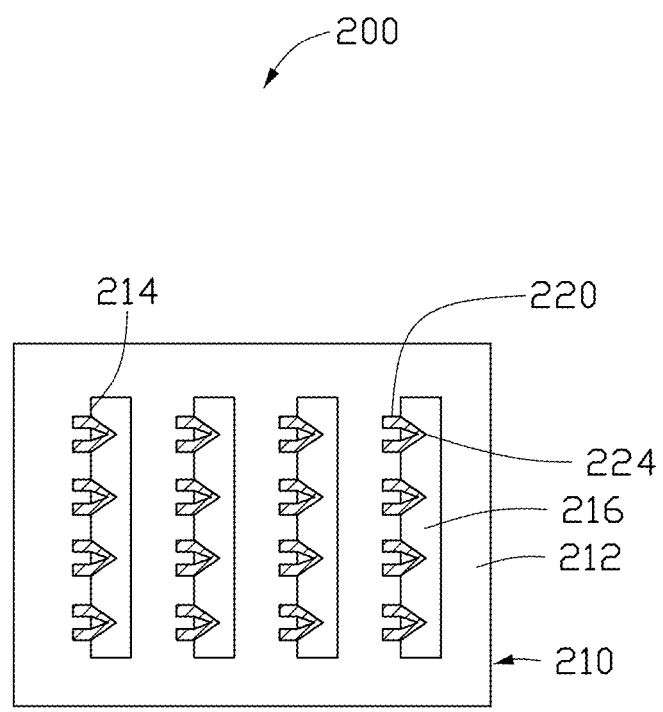
FIG. 9 is a schematic top view of another embodiment of an array of carbon nanotube micro-tip structures.

Referring to FIG. 9, one embodiment of an array of carbon nanotube micro-tip structures 200 includes an insulating substrate 210 and a plurality of patterned carbon nanotube film structures 220. The plurality of patterned carbon nanotube film structures 220 are spaced from each other and partially located on a surface 212 of the insulating substrate 210. The insulating substrate 210 and the patterned carbon nanotube film structures 220 are similar to the above embodiment of the insulating substrate 110 and the patterned carbon nanotube film structure 120.

The difference is that a strip-shaped recess 216 is defined in the insulating substrate 210 at the surface 212. The edge 214 of the insulating substrate 212 having the portion of the patterned carbon nanotube film structures 220 protruding therefrom is an edge of the strip-shaped recess 216. The plurality of patterned carbon nanotube film structures 220 at the tip portions 224 protrude from the same edge 214 of the insulating substrate 210 and suspend above the strip-shaped recess 216. The strip-shaped recess 214 can be a blind groove or a through hole. In one embodiment, the strip-shaped recess 216 is a strip-shaped through hole.

In the embodiment as shown in FIG. 9, the insulating substrate 210 can define a plurality of spaced strip-shaped recesses 216 to have a plurality of edges 214. The plurality of strip-shaped recesses 216 can be parallel to each other. Each edge 214 of the surface 212 of the insulating substrate 210 can have a plurality of tip portions 224 of the patterned carbon nanotube film structures 220 protrude therefrom. In one embodiment, each edge 214 has the same number of protruded tip portions 224. In one embodiment, the patterned carbon nanotube film structures 220 at different strip-shaped recesses 216 are in accordance with each other to form an m×n array, wherein m is the number of the strip-shaped recesses 216, n is the number of the patterned carbon nanotube film structures 220 at each strip-shaped recess 216, m≥1, and n≥1.

Figure 10:
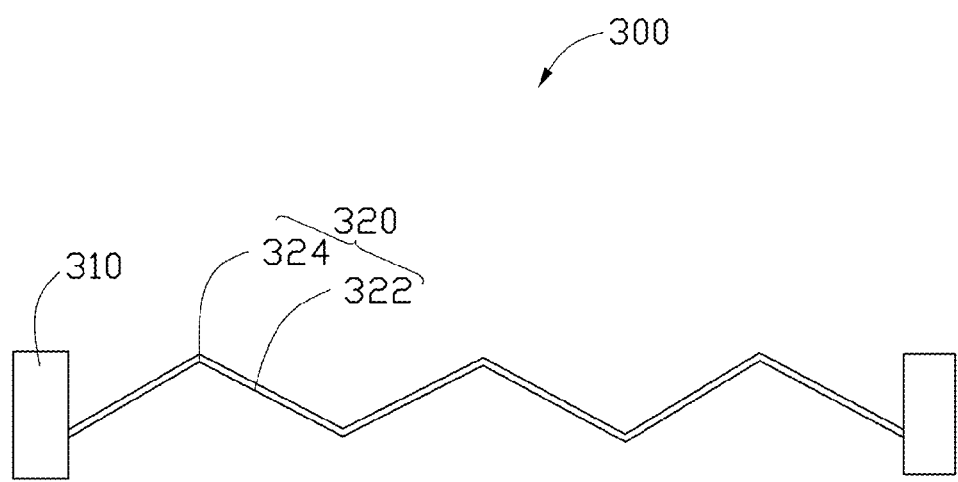
FIG. 10 is a schematic top view of another embodiment of the carbon nanotube micro-tip structure.

Referring to FIG. 10, another embodiment of an array of carbon nanotube micro-tip structures 300 similar to the above embodiment of array of carbon nanotube micro-tip structures 200, except that in the array of carbon nanotube micro-tip structures 300, the patterned carbon nanotube film structure 320 includes a plurality of strip-shaped arms 322 and a plurality of tip portions 324 formed by the plurality of strip-shaped arms 322. The plurality of strip-shaped arms 322 are joined end to end to form a zigzag-shaped structure having a plurality of tip portions 324 at two opposite directions of the patterned carbon nanotube film structure 320. The insulating substrate 310 may only support the two strip-shaped arms 322 at the ends of the zigzag-shaped structure, and the other strip-shaped arms 322 suspended therebetween.

Figure 11:
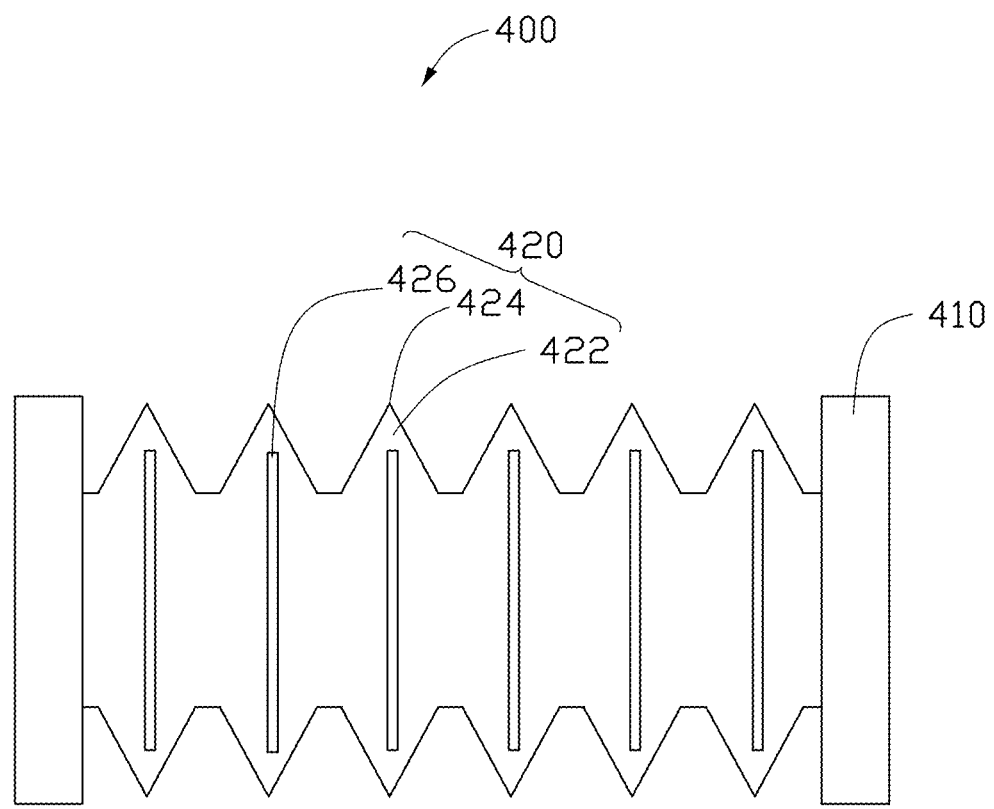
FIG. 11 is a schematic top view of still another embodiment of the carbon nanotube micro-tip structure.

Referring to FIG. 11, another embodiment of an array of carbon nanotube micro-tip structures 400 is similar to the above embodiment of array of carbon nanotube micro-tip structures 300, except that in the array of carbon nanotube micro-tip structures 400, the plurality of strip-shaped arms 422 are joined end to end to form a serrated structure having a plurality of tip portions 424 at two opposite directions of the patterned carbon nanotube film structure 420. The insulating substrate 410 may only support the two strip-shaped arms 422 at the ends of the serrated structure, and the other strip-shaped arms 422 suspended therebetween. The patterned carbon nanotube film structure 320 may also define a strip-shaped cutout 426 extended along a direction from one tip portion 424 to the opposite tip portion 424. Distances are defined from two ends of the cutout 426 to the two opposite tip portions 424. The strip-shaped through cutout 426 can increase the resistance at the tip portion 424.

Figure 12:
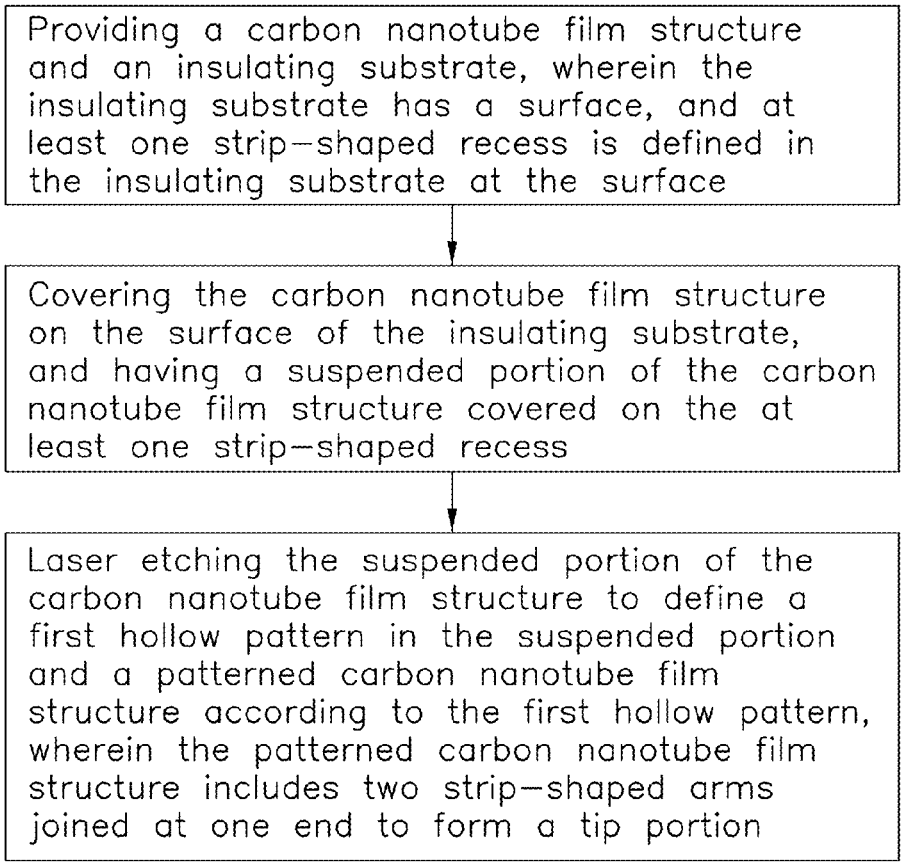
FIG. 12 is a flowchart of one embodiment of a method for making the carbon nanotube micro-tip structure.
Figure 13:
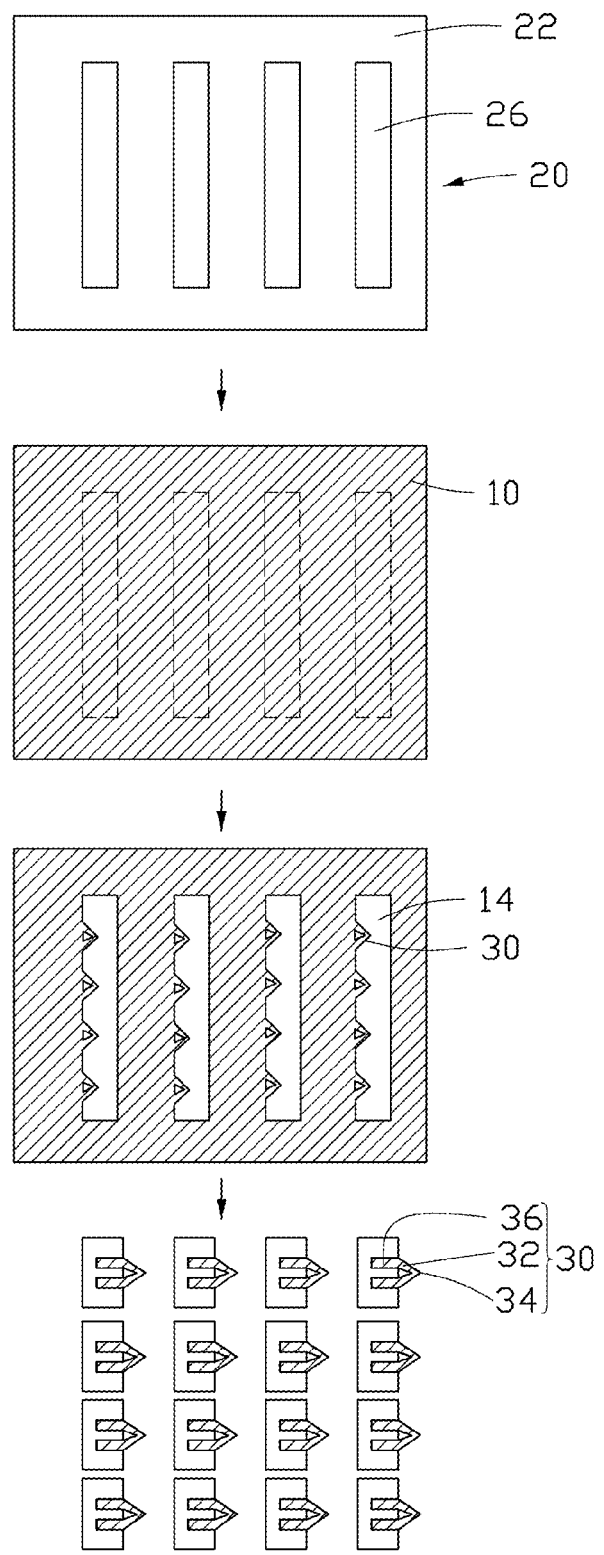
FIG. 13 is a schematic structural view of one embodiment of the method for making the carbon nanotube micro-tip structure.

Referring to FIG. 12 and FIG. 13, one embodiment of a method for making the carbon nanotube micro-tip structure includes steps of:

S1, providing a carbon nanotube film structure 10 and an insulating substrate 20, wherein the insulating substrate 20 has a surface 22, and at least one strip-shaped recess 26 is defined in the insulating substrate 22 at the surface 22;

S2, covering the carbon nanotube film structure 10 on the surface 22 of the insulating substrate 20, and having a suspended portion of the carbon nanotube film structure 10 suspended over the at least one strip-shaped recess 26; and S3, laser etching the suspended portion of the carbon nanotube film structure 10 to define a first hollow pattern 14 in the suspended portion and form a patterned carbon nanotube film structure 30 according to the first hollow pattern 14, wherein the patterned carbon nanotube film structure 30 includes two strip-shaped arms 32 joined at one end to form a tip portion 34. The tip portion 34 is suspended above the strip-shaped recess 26.

In the step S1, the carbon nanotube film structure 10 can be formed by steps of:

S11, providing a plurality of carbon nanotube films;

S12, stacking the plurality of carbon nanotube films along different directions on a frame; and S13, treating the plurality of carbon nanotube films on the frame using an organic solvent to form a carbon nanotube film structure 10.

The carbon nanotube film can be drawn from a carbon nanotube array. The carbon nanotube film includes a plurality of carbon nanotubes joined end to end by van der Waals attractive force therebetween and aligned along substantially the same direction. The carbon nanotube films can be covered on the frame one by one to laminate together and suspend across the frame. The stacking directions of carbon nanotube films can be different, or the carbon nanotube films can be stacked along only several (e.g., two) directions. The carbon nanotube film structure is a free-standing structure supported only by the frame and suspended across the frame. In one embodiment, the frame has a square shape with each edge having a length of about 72 millimeters, and 50 carbon nanotube films are stacked on the frame. The carbon nanotube film is treated by applying the organic solvent to the drawn carbon nanotube film to soak the entire surface of the stacked carbon nanotube films and then removing the organic solvent by drying. In the step S13, the carbon nanotube films can be soaked by the organic solvent. The organic solvent can be a volatile solvent at room temperature such as an ethanol, methanol, acetone, dichloroethane, chloroform, or any appropriate mixture thereof. After being soaked by the organic solvent, the adjacent carbon nanotube films can be combined together by surface tension of the organic solvent when the organic solvent volatilizes until the stable carbon nanotube film structure 10 is achieved. The method for drawing and stacking the carbon nanotube films are taught in US patent publication number 2008/0248235A1.

In the step S1, the insulating substrate 20 can be etched or laser cut to form a plurality of strip-shaped recesses 26 at the surface 22. In one embodiment, the strip-shaped recesses 26 are a plurality of strip-shaped through holes formed by using a reactive iron etching (ME) method. In the step S1, a plurality of spaced strip-shaped recesses 26 can be formed on the insulating substrate 20 to prepare an array of carbon nanotube micro-tip structures or a batch of carbon nanotube micro-tip structures. The plurality of spaced strip-shaped recesses 26 can be parallel to each other in the lengthwise direction.

In the step S2, the previously formed carbon nanotube film structure 10 is laid on the surface 22 of the insulating substrate 20. After the step S2 of covering the carbon nanotube film structure 10 on the surface 22 of the insulating substrate 20, an additional step of treating the carbon nanotube film structure 10 with the organic solvent similar to the step S13, can be processed. After the carbon nanotube film structure 10 is soaked by the organic solvent and the organic solvent is volatilized from the carbon nanotube film structure 10, the carbon nanotube film structure 10 can be combined tightly with the surface 22 of the insulating substrate 20, thus fixing the carbon nanotube film structure 10 on the insulating substrate 20.

In the step S3, a laser device is provided to emit a laser beam. The carbon nanotube film structure 10 is irradiated by the laser beam which is focused on the surface of the carbon nanotube film structure 10 to burn the irradiated portions of the carbon nanotube film structure 10. The laser beam scans the portions of the carbon nanotube film structure 10 to be etched out. The laser etching is carried out in an environment with oxygen, for example, in air. The carbon nanotubes in the irradiated portions absorb the laser beam energy, react with the oxygen in the air, and then decompose. Thus, the carbon nanotubes in the irradiated portions will be removed. The laser device can have a power of approximately 2 watts to about 50 watts. A scanning rate of the laser beam can be about 0.1 millimeter/second to about 10000 millimeter/second. A width of the laser beam can be about 1 micron to about 400 microns. In one embodiment, the laser device is an yttrium aluminum garnet laser device having a wavelength of about 1.06 microns, a power of about 3.6 watts, and a scanning rate of about 100 millimeter/second. Referring back to FIG. 5, due to the laser etching, the etched edge of the carbon nanotube film structure 10 formed by the laser etching has a blade-shaped thickness (i.e., the closer to the edge, the smaller the thickness). Thus, the two strip-shaped arms 32 and the tip portion 34 formed by the laser etching step can have the blade-shaped thickness. Referring back to FIG. 7, due to the laser etching, some of the outermost carbon nanotubes which may be partially etched by the laser beam have an open end at the etched edge.

Referring back to FIG. 6, in a microscopic view, the laser etching may form a relatively smooth top of the tip portion 34. To facilitate the field emission, an additional step of protruding the carbon nanotubes from the top of the tip portion 34 can be further processed. Specifically, in this additional step, some carbon nanotubes on the top of the tip portion 34 can be grabbed by a tool and pulled out from the top of the tip portion 34. The tool can be an adhesive such as a glue rod or an adhesive tape. The adhesive can grab the carbon nanotubes by contacting the carbon nanotubes. The adhesive can be moved away from the tip portion 34 to draw the carbon nanotubes until the carbon nanotubes are protruding from the top of the tip portion 34. The tool can be tweezers.

To form a batch of carbon nanotube micro-tip structures at one time or an array of carbon nanotube micro-tip structures 300, a plurality of first hollow patterns 14 can define a plurality of patterned carbon nanotube film structures 30 arranged in an array, protruded from the edge of the surface 22 of the insulating substrate 20 and suspended above the strip-shaped recesses 26.

To be used in a thermionic emission device or a thermal field emission device, a cutout can be formed by the laser etching of the step S3 on the patterned carbon nanotube film structure 30 to increase the resistance at the tip portion 34. The cutout has a lengthwise direction parallel to the surface 22 of the insulating substrate 20 and extends along a direction from the edge of the surface 22 to the tip portion 34.

The embodiment of the method for making the carbon nanotube micro-tip structure can further include a step S4 of patterning on-surface-portion of the carbon nanotube film structure 10 to form two connecting portions 36 respectively connected to the two strip-shaped arms 32 in a one to one manner. Applied to the insulating substrate 20, the carbon nanotube film structure 10 can have two kinds of portions: the on-surface-portion and the suspended portion. The on-surface-portion is the portion of the carbon nanotube film structure 10 located on the surface 22 of the insulating substrate 20.

The laser etching is performed on suspended portions of carbon nanotube film structure to prevent the heat absorption from the insulating substrate. Therefore, to easily pattern the on-surface-portion of the carbon nanotube film structure 10, the step S4 may be processed by different methods.

Figure 14:
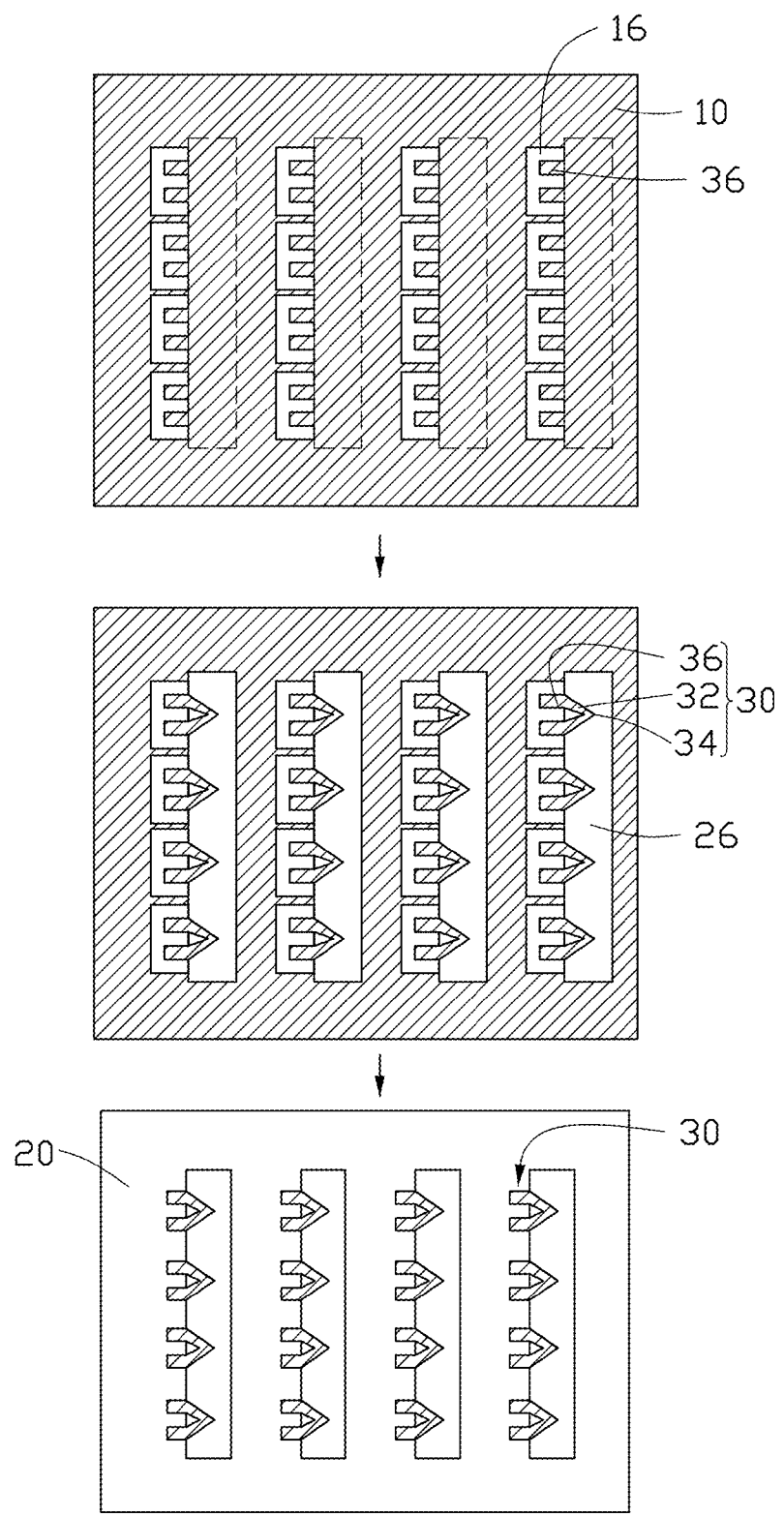
FIG. 14 is a schematic structural view of one embodiment of the method for making the carbon nanotube micro-tip structure including a method (1).

Referring to FIG. 14, a method (1) includes a step of previously laser etching the carbon nanotube film structure 10 before the step S2 of covering the carbon nanotube film structure 10 on the insulating substrate 20 to define a second hollow pattern 16 and the two connecting portions 36 according to the second hollow pattern 16. In this step, the carbon nanotube film structure 10 can be suspended across a frame during the laser etching. Therefore, the second hollow pattern 16 of the carbon nanotube film structure 10 can be easily laser etched. The two connecting portions 36 defined by the second hollow pattern 16 is located in the place according to where the two strip-shaped arms 32 will be formed in the following step S3. After the step S3, the finally achieved two strip-shaped arms 32 and the two connecting portions 36 are respectively connected. After the step S3, the first hollow pattern 14 and the second hollow pattern 16 cooperatively define the patterned carbon nanotube film structure 30 having the connecting portions 36 and the strip-shaped arms 32. The other portion of the carbon nanotube film structure 10 is isolated from the patterned carbon nanotube film structure 30 by the first hollow pattern 14 and the second hollow pattern 16. An additional step of removing the other portion of the carbon nanotube film structure 10 can be further included by the method (1), processed by simply peeling the other portion of the carbon nanotube film structure 10 from the surface 22 of the insulating substrate 20.

Figure 15:
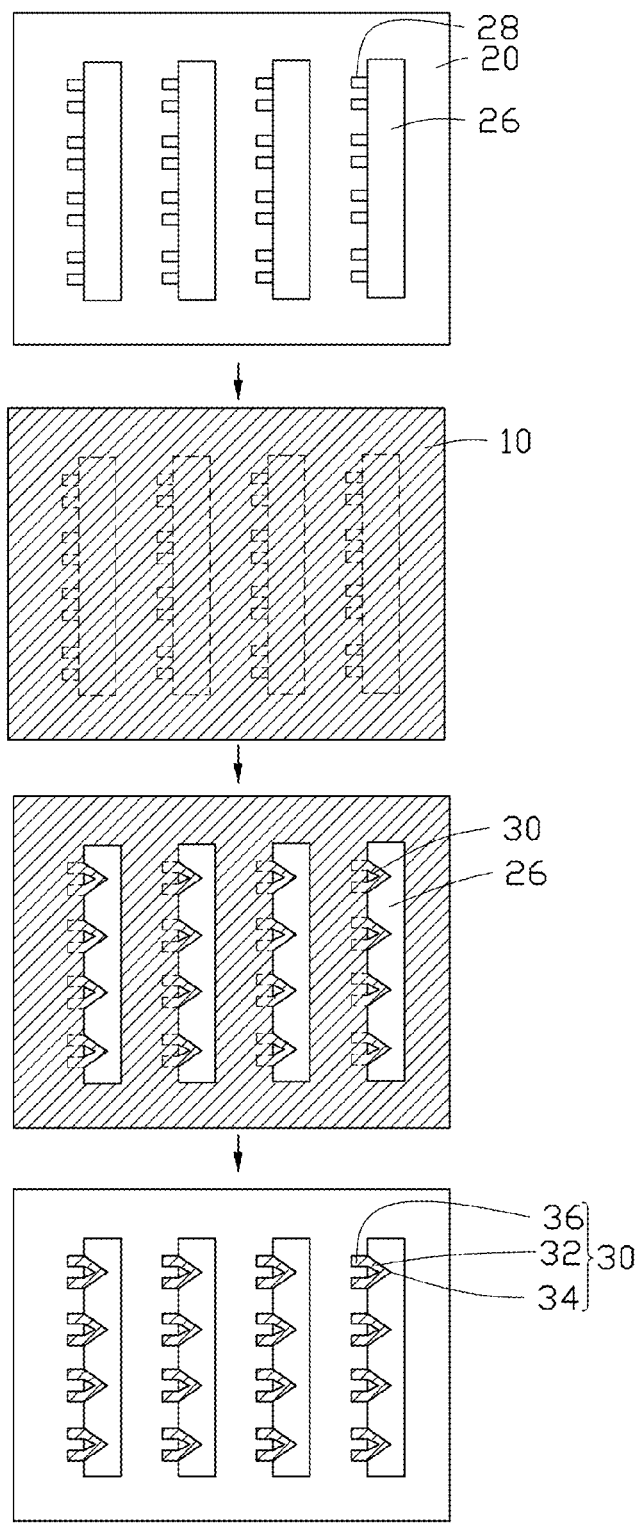
FIG. 15 is a schematic structural view of another embodiment of the method for making the carbon nanotube micro-tip structure including a method (2).

Referring to FIG. 15, a method (2) includes steps of: previously forming a connecting portion etching groove 28 on the surface 22 of the insulating substrate 20 before the step S2 of covering the carbon nanotube film structure 10 on the insulating substrate 20; and laser etching the portion of the carbon nanotube film structure 10 suspended above the connecting portion etching groove 28 after the step S2. The connecting portion etching groove 28 can be a V-shaped groove with a relatively narrow width. The connecting portion etching groove 28 defines the outline of the two connecting portions 36 and reaches to the strip-shaped recess 26. The portion of the carbon nanotube film structure 10 covering the connecting portion etching groove 28 is suspended above the connecting portion etching groove 28, thus can be totally etched out by the laser etching. The patterned carbon nanotube film structure 30 having the two connecting portions 36 and the two strip-shaped arms 32 can be isolated from the other portions of the carbon nanotube film structure 10 by laser etching the portion of the carbon nanotube film structure 10 suspended above the connecting portion etching groove 28. Similar to the method (1), the other portion of the carbon nanotube film structure 10 can be easily removed from the surface 22 of the insulating substrate 20.

Figure 16:
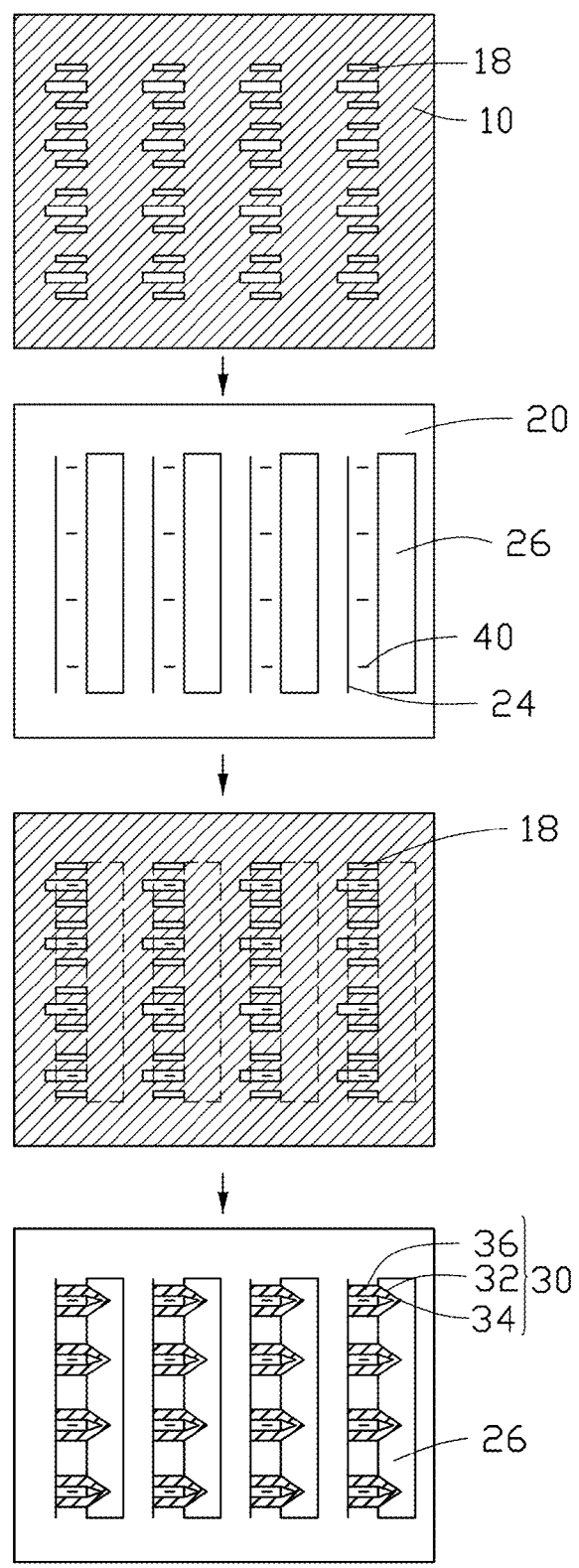
FIG. 16 is a schematic structural view of still another embodiment of the method for making the carbon nanotube micro-tip structure including a method (3).

Referring to FIG. 16, a method (3) includes both the steps of previously etching the insulating substrate 20 and previously etching the carbon nanotube film structure 10. The method (3) includes steps of:

S41, previously laser etching the carbon nanotube film structure 10 before the step S2 of covering the carbon nanotube film structure 10 on the insulating substrate 20 to define a third hollow pattern 18;

S42, according to the third hollow pattern 18, previously forming an assisted etching groove 24 on the surface 22 of the insulating substrate 20 before the step S2, wherein the assisted etching groove 24, the third hollow pattern 18, and the strip-shaped recess 26 cooperatively define the outline of the two connecting portions 36;

S43, after the step S2 of covering the carbon nanotube film structure 10 on the insulating substrate 20, laser etching the portion of the carbon nanotube film structure 10 suspended above the assisted etching groove 24, to totally isolate the patterned carbon nanotube film structure 30 having the two connecting portions 36 and the two strip-shaped arms 32 from the other portions of the carbon nanotube film structure 10; and S44, removing the other portions of the carbon nanotube film structure 10 from the surface 22 of the insulating substrate 20.

The third hollow pattern 18 of the method (3) and the second hollow pattern 16 of the method (1) of the carbon nanotube film structure 10 can be formed by the same method. The assisted etching groove 24 of the method (3) and the connecting portion etching groove 28 of the method (2) can be formed by the same method.

In one embodiment, the assisted etching groove 24 includes a plurality of line-shaped grooves spaced from each other and parallel to the lengthwise direction of the strip-shaped recesses 26. Each strip-shaped recess 26 has one line-shaped groove located at one side thereof. The third hollow pattern 18 can be a plurality of groups of strip-shaped through holes. Each group of strip-shaped through holes can include three strip-shaped through holes parallel to and spaced from each other. The length direction of the strip-shaped through holes can be perpendicular to the line shaped grooves. The strip-shaped through holes can be located between one line-shaped groove and one strip-shaped recess. The two ends of the strip-shaped through holes along the length direction can respectively reach the line shaped groove and the strip-shaped recess, to define the outline of the connecting portions 36 and isolate the connecting portions 36 from the other portions of the carbon nanotube film structure 10.

Figure 17:
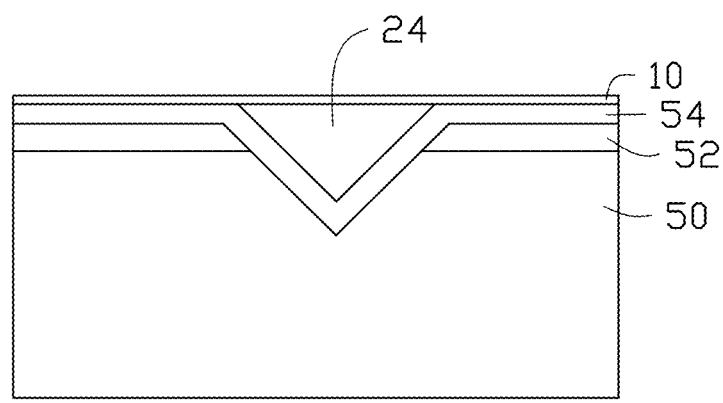
FIG. 17 is a cross-sectional view of an insulating substrate having an assisted etching groove.

Referring to FIG. 17, a method for forming the assisted etching groove 24 on the surface 22 of the insulating substrate 20 can include steps of: providing a silicon substrate 50; depositing a silicon nitride layer 52 on a surface of the silicon substrate 50; patterning the silicon nitride layer 52 through a lithography method to expose the surface of the silicon substrate 50 that is to be etched out from the silicon nitride layer 52; treating the silicon substrate 50 having the patterned silicon nitride layer 52 with a reacting solution (e.g., a KOH solution), to etch the exposed silicon substrate 50 and form the assisted etching groove 24; and forming a silicon oxide film 54 on the surface of the silicon substrate 50 by using a plasma-enhanced chemical vapor deposition method. In one embodiment, the silicon oxide film 54 has a thickness of about 1 micron, and the assisted etching groove 24 has a V-shaped cross-section. After covering the assisted etching groove 24 with the carbon nanotube film structure 10, the carbon nanotube film structure 10 is suspended across the assisted etching groove 24, and can be etched out by laser etching.

To facilitate locating the carbon nanotube film structure 10 on the surface 22 of the insulating substrate 20, an additional step S5 of forming a plurality of location assisted lines 40 can be further processed. The location assisted lines 40 helps finding the location of the strip-shaped recesses 26 when covering the carbon nanotube film structure 10 on the insulating substrate 20, to arrange the second hollow pattern 16 or the third hollow pattern 18 of the carbon nanotube film structure 10 at a right place according to the strip-shaped recesses 26. The location assisted lines 40 can be perpendicular to the lengthwise direction of the strip-shaped recesses 26. To form an array of carbon nanotube micro-tip structures, each of the strip-shaped recesses 26 can have a plurality of location assisted lines 40 formed on a side thereof. In one embodiment, the plurality of location assisted lines 40 at a side of one strip-shaped recess 26 are spaced an even distance.

Referring back to FIG. 13, the method for forming the carbon nanotube micro-tip structure can further include an additional step S6 of cutting the insulating substrate 20 to separate the plurality of patterned carbon nanotube film structures 30, and form a plurality of carbon nanotube micro-tip structures. In one embodiment, the insulating substrate 20 having the array of carbon nanotube micro-tip structures has a size of 25 millimeters×26.8 millimeters. After cutting, the insulating substrate 20 having the single carbon nanotube micro-tip structure has a size of 3 millimeters×4 millimeters.

The above embodiments of carbon nanotube micro-tip structures and array of carbon nanotube micro-tip structures can all be formed by the above method. In some embodiments (e.g., shown in FIG. 10 and FIG. 11), the carbon nanotube film structure can be covered on a strip-shaped recess having a wide width and laser etched to form the carbon nanotube micro-tip structure having the plurality of tip portions.

Figure 18:
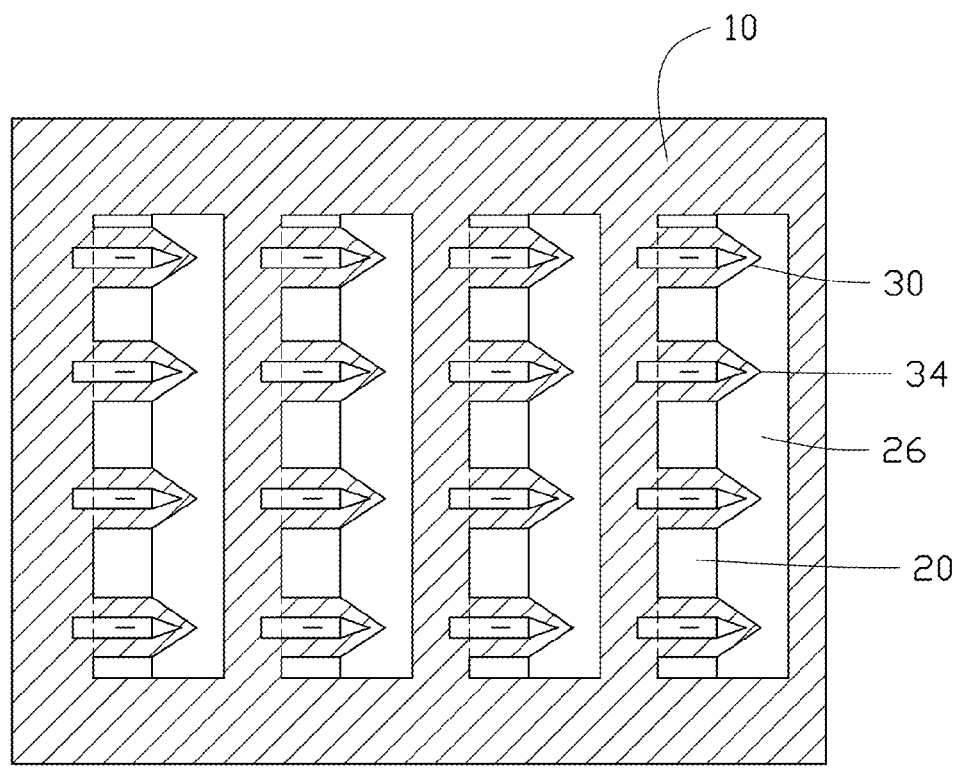
FIG. 18 is a top view of another embodiment of an array of the carbon nanotube micro-tip structures.
Figure 19:
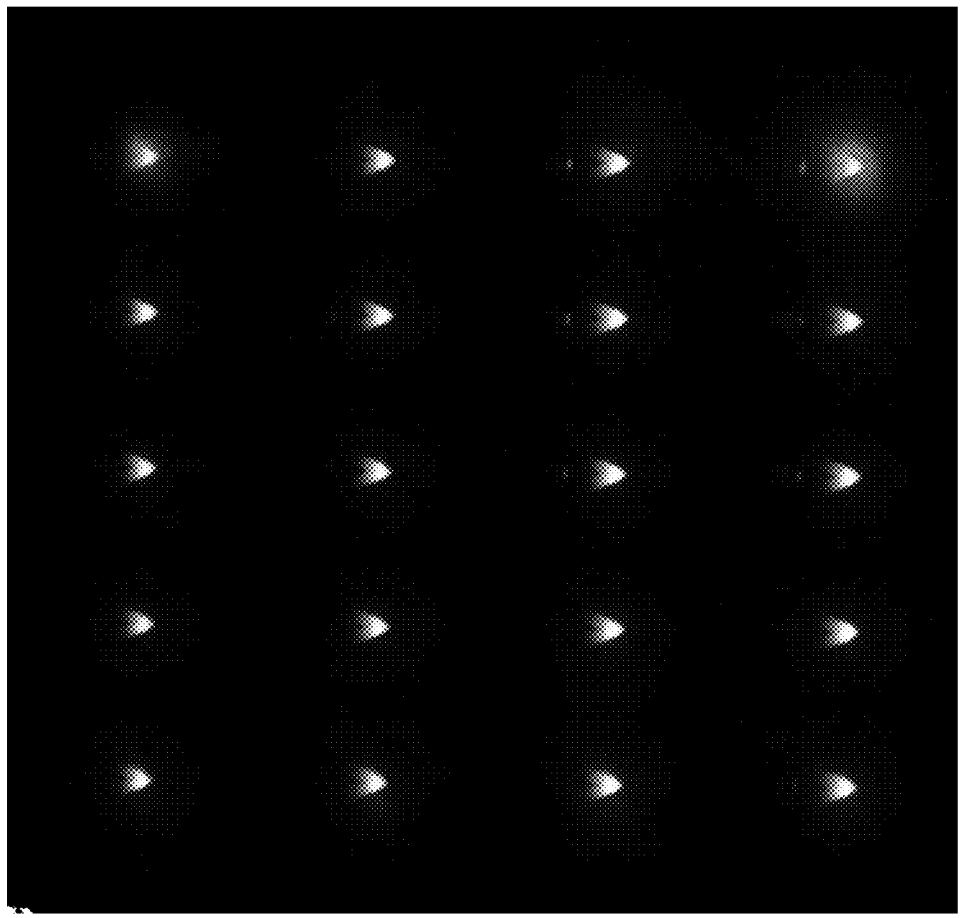
FIG. 19 is an optical photo of one embodiment of an array of the carbon nanotube micro-tip structures illuminated in vacuum.
Figure 20:
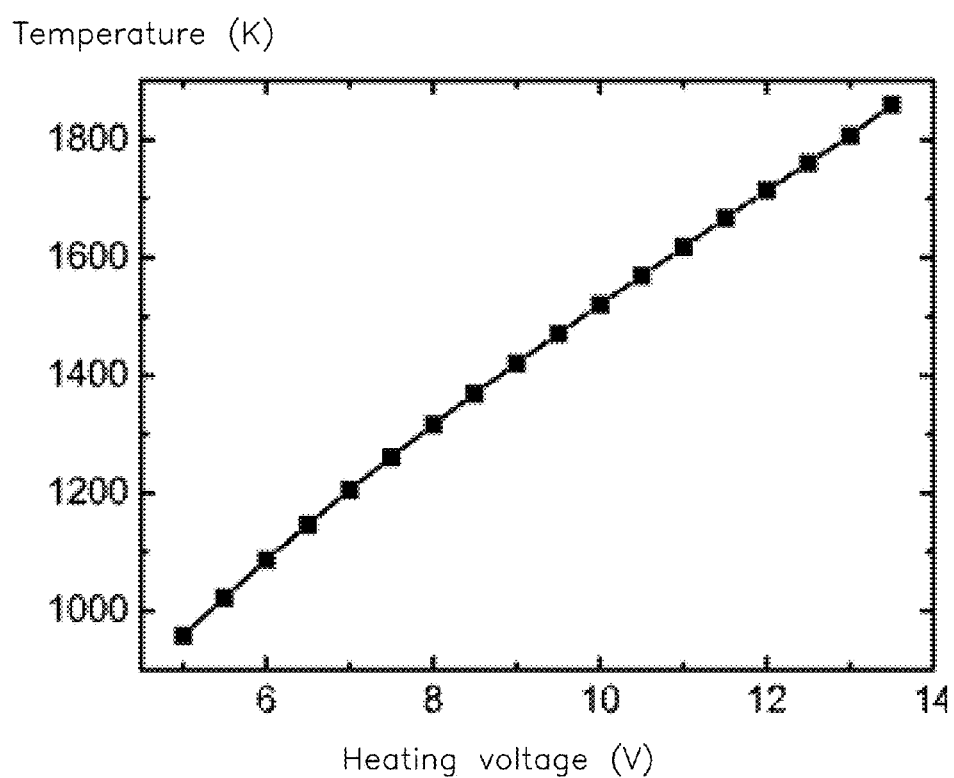
FIG. 20 shows a test curve of a relationship between a temperature at the tip portion of one embodiment of the carbon nanotube micro-tip structure and a voltage.
Figure 21:
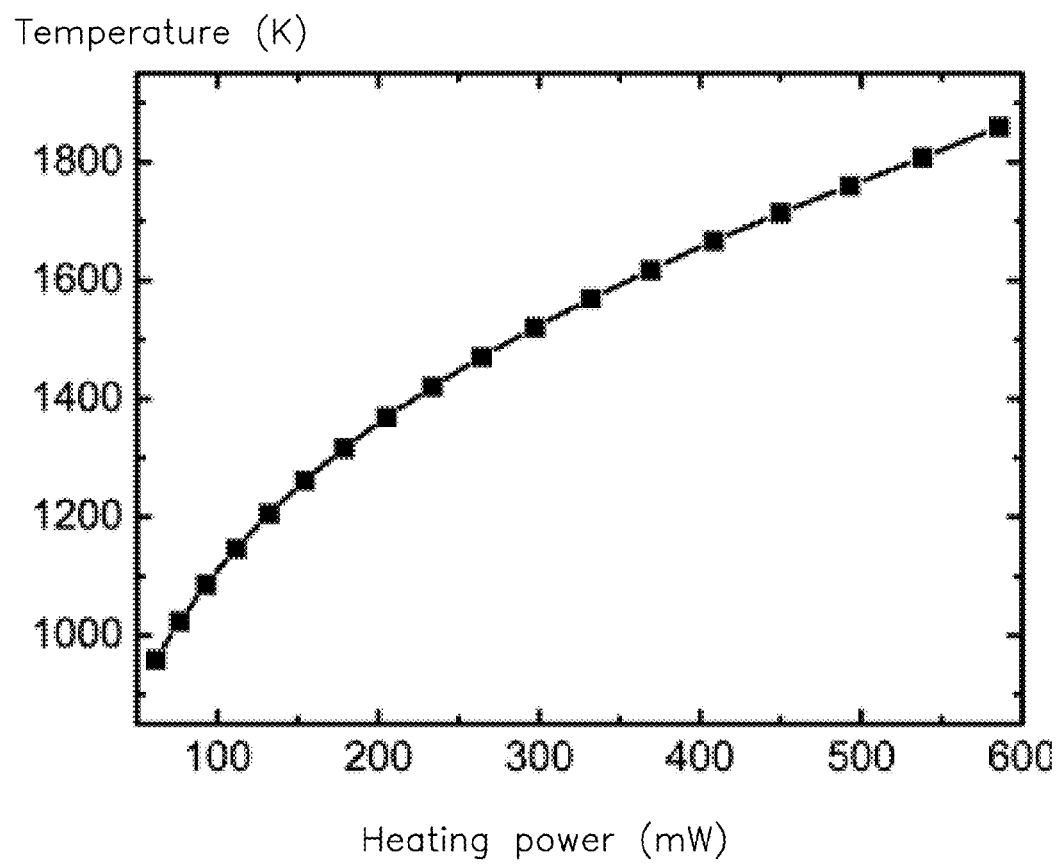
FIG. 21 shows a test curve of a relationship between a temperature at the tip portion of one embodiment of the carbon nanotube micro-tip structure and a power.

Referring to FIG. 18, to test the joule heating performance, the two connecting portions of the carbon nanotube micro-tip structure can be connected between the positive and negative electrodes of a direct current power source to electrically conduct the carbon nanotube micro-tip structure in vacuum. In one embodiment, some other portions of the carbon nanotube film structure 10 can be kept in the step S44, to electrically connect the plurality of patterned carbon nanotube film structures 30 together. Specifically, the plurality of patterned carbon nanotube film structures 30 suspended above the same strip-shaped recess 26 are connected in series, and the plurality of patterned carbon nanotube film structures 30 suspended above different strip-shaped recesses 26 are connected in parallel. Referring to FIG. 19, when the plurality of patterned carbon nanotube film structures 30 are powered by the direct current power source, the plurality of tip portions 34 can be illuminated and emit visible lights. Referring to FIG. 20 and FIG. 21, the carbon nanotube micro-tip structure is heated during the electrifying. The heating temperature and the voltage and power of the direct current have a linear relationship. The carbon nanotube micro-tip structure can be heated to about 1860 K at a voltage of about 13.5 V and a power of about 0.586 mW.

Figure 22:
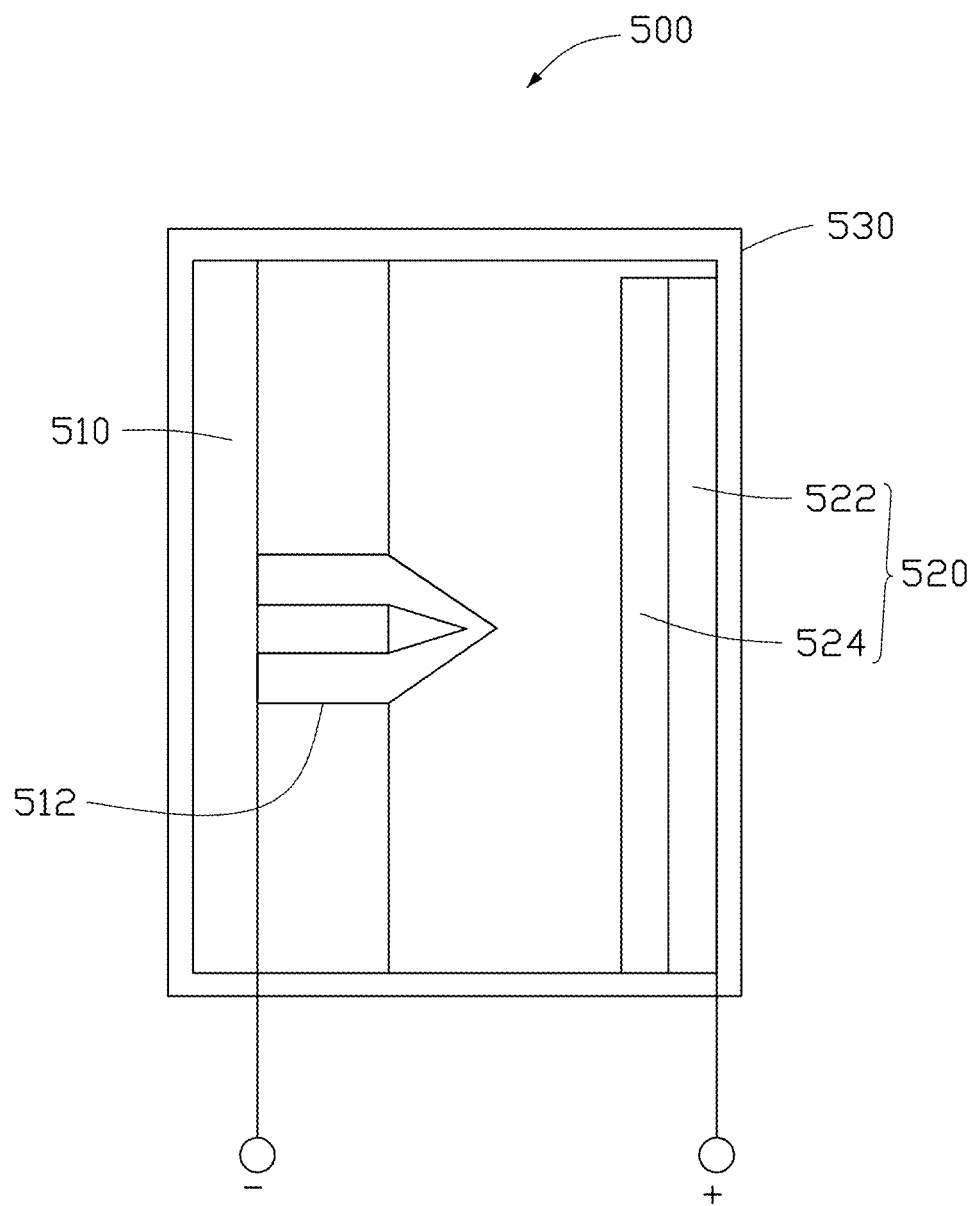
FIG. 22 is a schematic top view of one embodiment of a field emission device.

Referring to FIG. 22, one embodiment of a field emission election source 510 includes a carbon nanotube micro-tip structure 512. The carbon nanotube micro-tip structure 512 includes an insulating substrate and a patterned carbon nanotube film structure. The insulating substrate includes a surface. The surface has an edge. The patterned carbon nanotube film structure is partially arranged on the surface of the insulating substrate. The patterned carbon nanotube film structure includes two strip-shaped arms. The two strip-shaped arms are joined at one end to form a tip portion of the patterned carbon nanotube film structure. An angle α between the lengthwise directions of the two strip-shaped arms can be smaller than 180°. The tip portion of the patterned carbon nanotube film structure protrudes from the edge of the surface of the insulating substrate and suspended. The patterned carbon nanotube film structure includes a plurality of carbon nanotubes parallel to the surface of the insulating substrate.

The carbon nanotube micro-tip structure 512 can be the same as any one of the above embodiments of carbon nanotube micro-tip structures.

One embodiment of a field emission device 500 includes the field emission electron source 510 and an anode electrode 520. The anode electrode 520 is spaced from and opposite to the field emission electron source 510. In use, a positive voltage is applied to the anode electrode 520, a negative voltage is applied to the carbon nanotube micro-tip structure 512 of the field emission electron source 510, and electrons are emitted from the tip portion of the patterned carbon nanotube film structure.

The field emission device 500 can be a light source or a displaying device. The anode electrode 520 can include an anode electrode layer 522 and a fluorescent layer 524 laminated together. The fluorescent layer 524 faces the tip portion of the patterned carbon nanotube film structure. The electrons emitted from the tip portion reach the anode electrode 520 and lighten the fluorescent layer 524.

The field emission device 500 can further include a sealing structure 530 to seal the field emission electron source 510 and the anode electrode 520 therein in a vacuum. In one embodiment, the vacuum degree in the sealing structure 530 is about $2 \times 10^{-5}$ Pa.

Figure 23:
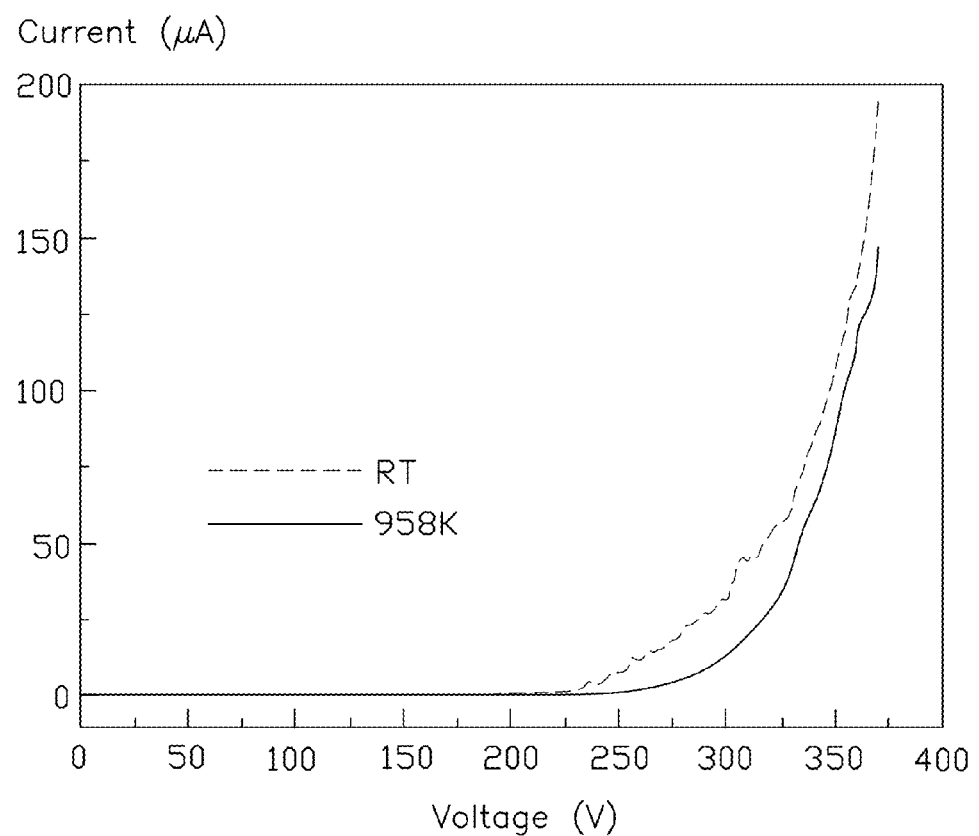
FIG. 23 shows test curves of a current-voltage relationship of one embodiment of the carbon nanotube micro-tip structure at room temperature and high temperature.
Figure 24:
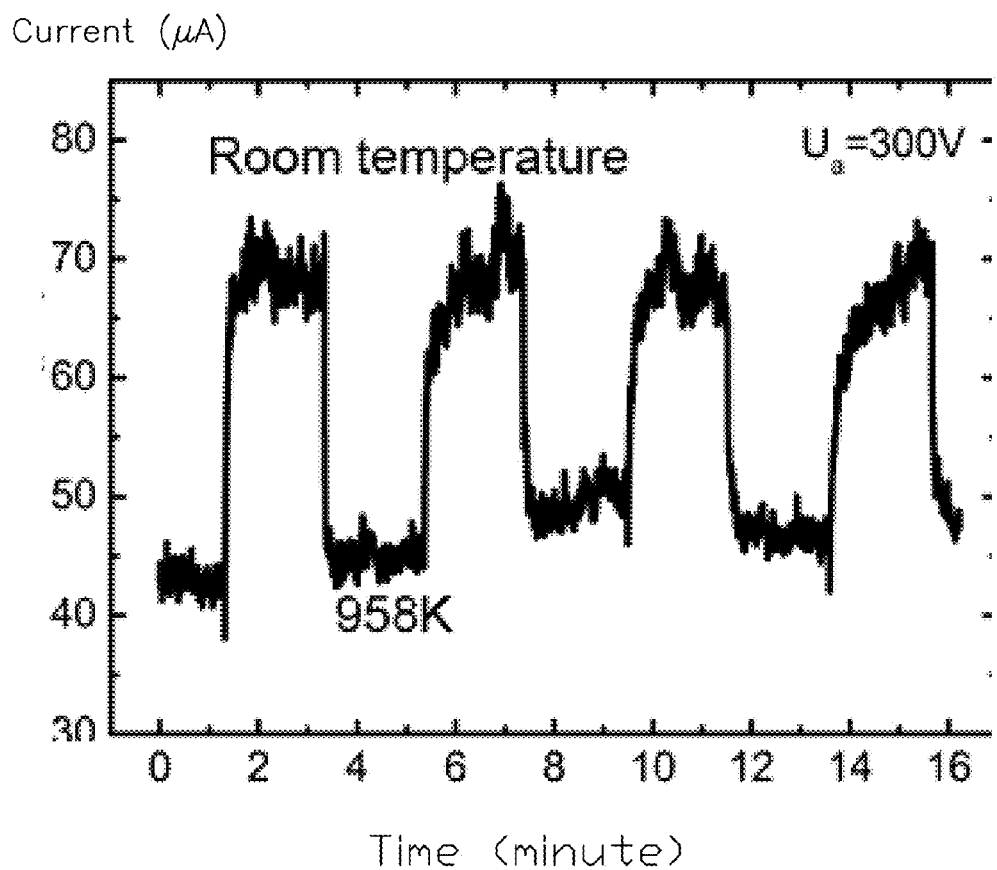
FIG. 24 shows field emitting current response curves of one embodiment of the carbon nanotube micro-tip structure at alternating temperatures from room temperature to high temperature.
Figure 25:
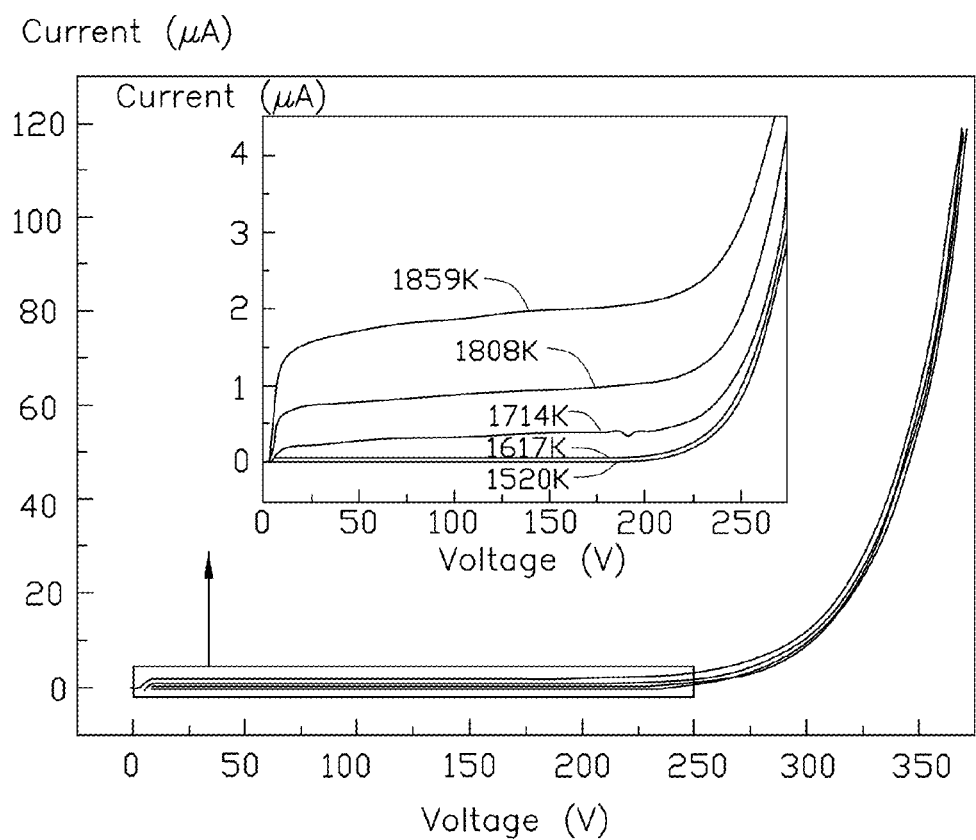
FIG. 25 shows test curves of a current-voltage relationship of the carbon nanotube micro-tip structure at different temperatures.

Referring to FIG. 23, the field emission device 500 is tested at room temperature and 958K respectively. One embodiment of the carbon nanotube micro-tip structure can emit an intrinsic field emission current of about 150 μA. Due to the Joule heating effect, the field emission current of the carbon nanotube micro-tip structure at 958K is decreased. Referring to FIG. 24, by alternating the heating temperatures of the carbon nanotube micro-tip structure between room temperature and 958K, the field emission current has a corresponding change. The response speed of the field emission current change is very fast. Due to the relatively large resistance of the tip portion of the carbon nanotube micro-tip structure, the tip portion can be heated at a high temperature simply by electrifying the carbon nanotube micro-tip structure. Thus, the carbon nanotube micro-tip structure has a relatively good thermal field emission performance. Referring to FIG. 25, the field emission device 500 can have a thermal field emission by electrifying the carbon nanotube micro-tip structure while having a voltage difference between the carbon nanotube micro-tip structure and the anode electrode 520. The field emission device 500 has a lower turn-on voltage of the field emission at high temperature than at room temperature. The thermal field emission current increases with the heating temperature.

Figure 26:
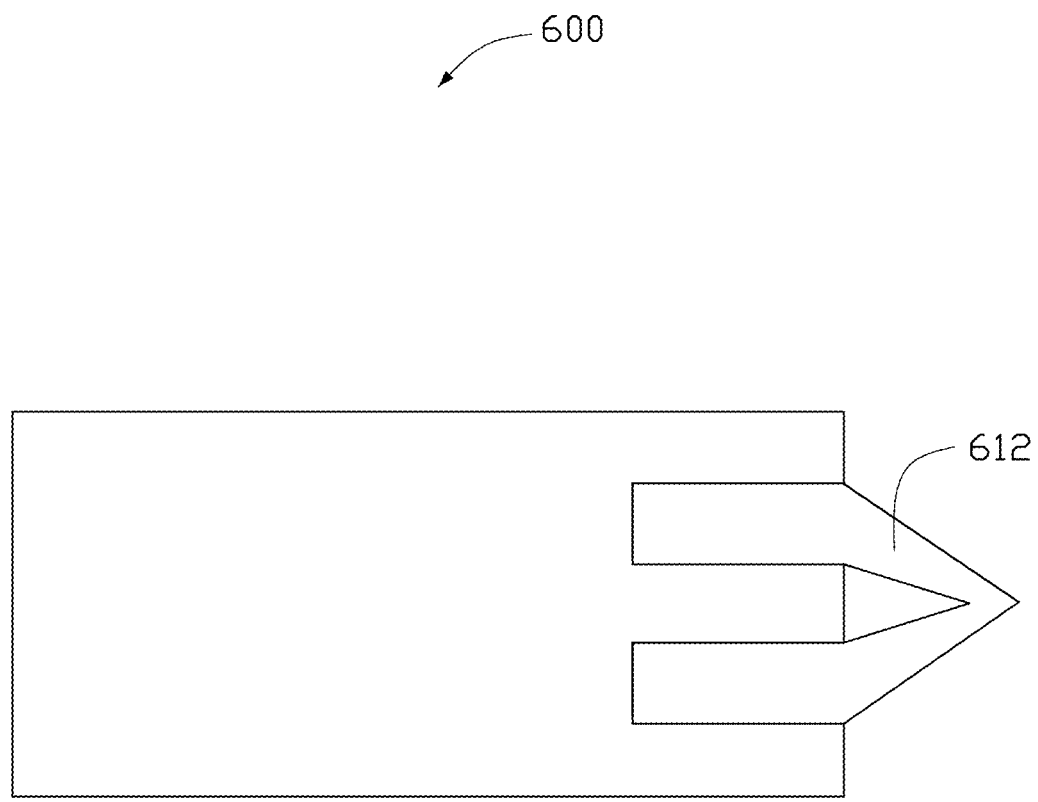
FIG. 26 is a schematic top view of one embodiment of an atomic force microscope probe.

Referring to FIG. 26, an embodiment of an atomic force microscope probe 600 includes a carbon nanotube micro-tip structure 612. The carbon nanotube micro-tip structure 612 includes an insulating substrate and a patterned carbon nanotube film structure. The insulating substrate includes a surface. The surface has an edge. The patterned carbon nanotube film structure is partially arranged on the surface of the insulating substrate. The patterned carbon nanotube film structure includes two strip-shaped arms. The two strip-shaped arms are joined at one end to form a tip portion of the patterned carbon nanotube film structure. An angle α between the lengthwise directions of the two strip-shaped arms can be smaller than 180°. The tip portion of the patterned carbon nanotube film structure protrudes and suspends from the edge of the surface of the insulating substrate. The patterned carbon nanotube film structure includes a plurality of carbon nanotubes parallel to the surface of the insulating substrate.

The carbon nanotube micro-tip structure 612 can be the same as any one of the above embodiments of carbon nanotube micro-tip structures.

The carbon nanotube micro-tip structure has a wide use, such as in a field emission display, SEM, TEM, x-ray tube, electron momentum spectroscopy, and so on. Further, the carbon nanotube micro-tip structure has a suspended tip portion which can be used in an atomic force microscope, transistor, MEMS, and so on.

It is to be understood that the above description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the disclosure. Variations may be made to the embodiments without departing from the spirit of the disclosure as claimed. Elements associated with any of the above embodiments are envisioned to be associated with any other embodiments. The above-described embodiments illustrate the scope of the disclosure but do not restrict the scope of the disclosure.

What is claimed is:

1. An array of carbon nanotube micro-tip structures comprising:
   an insulating substrate comprising a surface, the surface comprising an edge; and
   a patterned carbon nanotube film structure partially arranged on the surface of the insulating substrate and comprising a plurality of carbon nanotubes parallel to the surface of the insulating substrate, wherein the patterned carbon nanotube film structure comprising a plurality of suspended tip portions, the patterned carbon nanotube film structure comprises a plurality of strip-shaped arms, the plurality of suspended tip portions are formed by the plurality of strip-shaped arms, and the plurality of strip-shaped arms are joined end to end to form a zigzag line shaped structure.

2. The array of carbon nanotube micro-tip structures of claim 1, wherein the plurality of suspended tip portions are located at two opposite directions of the patterned carbon nanotube film structure.

3. The array of carbon nanotube micro-tip structures of claim 1, wherein the insulating substrate only supports two strip-shaped arms at ends of the zigzag-line shaped structure, and other strip-shaped arms suspended therebetween.

4. The array of carbon nanotube micro-tip structures of claim 1, wherein each of the plurality of strip-shaped arms comprises a plurality of carbon nanotube films stacked together.

5. The array of carbon nanotube micro-tip structures of claim 4, wherein each of the plurality of carbon nanotube films comprises the plurality of carbon nanotubes substantially aligned along a same direction, and an angle β between the plurality of carbon nanotubes in different carbon nanotube films is in a range of $0° < \beta \leq 90°$.

6. The array of carbon nanotube micro-tip structures of claim 5, wherein the patterned carbon nanotube film structure comprises 50 stacked carbon nanotube films having the angle β of about 90° between the plurality of carbon nanotubes of adjacent carbon nanotube films.

7. An array of carbon nanotube micro-tip structures comprising:
   an insulating substrate comprising a surface, the surface comprising an edge; and a patterned carbon nanotube film structure partially arranged on the surface of the insulating substrate and comprising a plurality of carbon nanotubes parallel to the surface of the insulating substrate, wherein the patterned carbon nanotube film structure comprising a plurality of suspended tip portions, the patterned carbon nanotube film structure comprises a plurality of strip-shaped arms, the plurality of suspended tip portions are formed by the plurality of strip-shaped arms, and the plurality of strip-shaped arms are joined end to end to form a serrated structure.

8. The array of carbon nanotube micro-tip structures of claim 7, wherein the plurality of suspended tip portions are located at two opposite directions of the patterned carbon nanotube film structure.

9. The array of carbon nanotube micro-tip structures of claim 7, wherein the insulating substrate only supports two strip-shaped arms at ends of the serrated structure, and other strip-shaped arms suspended therebetween.

10. The array of carbon nanotube micro-tip structures of claim 7, wherein each of the plurality of strip-shaped arms comprises a plurality of carbon nanotube films stacked together.

11. The array of carbon nanotube micro-tip structures of claim 10, wherein the patterned carbon nanotube film structure comprises a strip-shaped cutout extended along a direction from one tip portion to one opposite tip portion.

12. The array of carbon nanotube micro-tip structures of claim 10, wherein each of the plurality of carbon nanotube films comprises the plurality of carbon nanotubes substantially aligned along a same direction, and an angle $\beta$ between the plurality of carbon nanotubes in different carbon nanotube films is in a range of $0°<\beta\leq90°$.

13. The array of carbon nanotube micro-tip structures of claim 12, wherein the patterned carbon nanotube film structure comprises 50 stacked carbon nanotube films having the angle $\beta$ of about 90° between the plurality of carbon nanotubes of adjacent carbon nanotube films.

* * * * *